United States Patent
Lee et al.

(10) Patent No.: US 9,136,404 B2
(45) Date of Patent: Sep. 15, 2015

(54) SOLAR CELL CAPABLE OF RECYCLING A SUBSTRATE AND METHOD FOR MANUFACTURING THE SAME

(75) Inventors: Jung-Ho Lee, Ansan-si (KR); Han-Don Um, Ansan-si (KR); Sang-Won Jee, Ansan-si (KR); Kwang-Tae Park, Ansan-si (KR); Hong-Seok Seo, Ansan-si (KR); Jin-Young Jung, Ansan-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 259 days.

(21) Appl. No.: 13/139,019

(22) PCT Filed: Oct. 27, 2009

(86) PCT No.: PCT/KR2009/006234
§ 371 (c)(1),
(2), (4) Date: Jun. 10, 2011

(87) PCT Pub. No.: WO2010/067958
PCT Pub. Date: Jun. 17, 2010

(65) Prior Publication Data
US 2011/0240104 A1 Oct. 6, 2011

(30) Foreign Application Priority Data

Dec. 10, 2008 (KR) .................. 10-2008-0125440
Jun. 25, 2009 (KR) .................. 10-2009-0056909
Oct. 26, 2009 (KR) .................. 10-2009-0101966

(51) Int. Cl.
*H01L 31/00* (2006.01)
*H01L 31/0216* (2014.01)
(Continued)

(52) U.S. Cl.
CPC ...... *H01L 31/02167* (2013.01); *H01L 31/0384* (2013.01); *H01L 31/035227* (2013.01);
(Continued)

(58) Field of Classification Search
CPC .................................................. H01L 31/0352
USPC ......................................................... 136/244
See application file for complete search history.

(56) References Cited

U.S. PATENT DOCUMENTS 4,165,241 A * 8/1979 Yerkes et al. ................. 136/256
4,568,791 A * 2/1986 Kawai ........................... 136/256
(Continued)

FOREIGN PATENT DOCUMENTS

EP      WO2008145176   * 12/2008   .................... 136/244
KR      10-2005-0087247   8/2005
(Continued)

OTHER PUBLICATIONS

Karg et al,"electron and hole transport in aSi1-x Gex H alloys", 1986.*
(Continued)

*Primary Examiner* — Jeffrey T Barton
*Assistant Examiner* — Uyen Tran
(74) *Attorney, Agent, or Firm* — Lexyoume IP Meister, PLLC

(57) ABSTRACT

The present invention relates to a solar cell that can recycle a substrate, and a manufacturing method thereof. The solar cell includes: i) a plurality of nano-structures distanced from each other and extended in one direction; ii) a first conductive layer covering a first end of at least one of the plurality of nano-structures; iii) a second conductive layer distanced from the first conductive layer and covering a second end of the nano-structure; and iv) a dielectric layer disposed between the first conductive layer and the second conductive layer.

15 Claims, 33 Drawing Sheets

(51) Int. Cl.
  *H01L 31/0352* (2006.01)
  *H01L 31/0384* (2006.01)
  *H01L 31/065* (2012.01)
  *H01L 31/068* (2012.01)
  *H01L 31/075* (2012.01)
  *H01L 31/18* (2006.01)

(52) U.S. Cl.
  CPC ...... *H01L31/035281* (2013.01); *H01L 31/065* (2013.01); *H01L 31/068* (2013.01); *H01L 31/075* (2013.01); *H01L 31/1804* (2013.01); *H01L 31/1892* (2013.01); *Y02E 10/547* (2013.01); *Y02E 10/548* (2013.01)

(56) References Cited

U.S. PATENT DOCUMENTS

| | | | |
|---|---|---|---|
| 2004/0095658 A1* | 5/2004 | Buretea et al. | 359/853 |
| 2006/0021647 A1* | 2/2006 | Gui et al. | 136/252 |
| 2008/0006319 A1* | 1/2008 | Bettge et al. | 136/244 |
| 2008/0213603 A1* | 9/2008 | Kobayashi et al. | 428/450 |
| 2009/0050204 A1* | 2/2009 | Habib | 136/261 |
| 2009/0078316 A1* | 3/2009 | Khazeni et al. | 136/257 |
| 2009/0253227 A1* | 10/2009 | Defries et al. | 438/72 |
| 2009/0296189 A1* | 12/2009 | Black et al. | 359/245 |
| 2010/0218813 A1* | 9/2010 | Guha et al. | 136/255 |

FOREIGN PATENT DOCUMENTS

| | | |
|---|---|---|
| KR | 10-0553418 | 2/2006 |
| KR | 10-2006-0074233 | 7/2006 |
| KR | 10-0809248 | 2/2008 |

OTHER PUBLICATIONS

Hanyang Univ., New Power for Green Growth, Technology Transfer Conference, Apr. 27, 2009, Samsung Coex Intercontinental Hotel.

* cited by examiner

SOLAR CELL CAPABLE OF RECYCLING A SUBSTRATE AND METHOD FOR MANUFACTURING THE SAME

CROSS-REFERENCE TO RELATED APPLICATION

This application claims priority to and the benefit of Korean Patent Application Nos. 10-2008-0125440, 10-2009-0056909, and 10-2009-0101966 filed in the Korean Intellectual Property Office on Dec. 10, 2008, Jun. 25, 2009, and Oct. 26, 2009 the entire contents of which are incorporated herein by reference.

BACKGROUND OF THE INVENTION (a) Field of the Invention

The present invention relates to a solar cell and a manufacturing method thereof. More particularly, the present invention relates to a solar cell that can recycle a substrate, and a manufacturing method thereof.

(b) Description of the Related Art

Recently, research and development on clean energy has been vigorously conducted due to depletion and increasing price of resources. Examples of the clean energy include a solar energy, wind energy, tidal energy, and so on. Particularly, a research and development on a solar cell to effectively use solar energy has been vigorously conducted.

The solar cell is a device that changes sunlight energy to electric energy. When sunlight is thrown on the solar cell, electrons and holes are generated from the solar cell. The electrons and holes move to a P electrode and an N electrode included in the solar cell, a potential difference occurs between the P electrode and the N electrode such that a current flows.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a solar cell that can recycle a substrate. In addition, the present invention provides a manufacturing method of the solar cell.

A solar cell according to an exemplary embodiment of the present invention includes: i) a plurality of nano-structures distanced from each other and extended in one direction; ii) a first conductive layer covering a first end of at least one of the plurality of nano-structures; iii) a second conductive layer distanced from the first conductive layer and covering a second end of the nano-structure; and iv) a dielectric layer disposed between the first conductive layer and the second conductive layer.

A silicide layer may be formed at the first end of the nano-structure, and a high-concentrated p-type doping area may be formed in the nano-structure contacting the silicide layer. The high-concentrated p-type doping area may be disposed in the first conductive layer.

The solar cell according to the exemplary embodiment of the present invention may further include i) a transparent contact layer disposed contacting the first conductive layer and ii) a light transmissive layer disposed contacting the transparent contact layer. The transparent contact layer may include indium tin oxide (ITO).

A metal nano-particle may be provided on a surface of at least one of the plurality of nano-structures. A nano-structure contacting at least one selected from a group consisting of the second conductive layer and the dielectric layer may include i) a first doping area and ii) a second doping area surrounding the first doping area in a direction that is parallel with a plate surface of the second conductive layer. The second doping area is n-type doped.

A nano-structure contacting at least one selected from a group consisting of the second conductive layer and the dielectric layer may include a first doping area and a second doping area contacting the first doping area in a length direction of the nano-structure. A nano-structure contacting at least one selected from a group consisting of the second conductive layer and the dielectric layer may include i) a first doping area, ii) an intrinsic area contacting the first doping area in a length direction of the nano-structure, and iii) a second doping area contacting the intrinsic area in the length direction of the nano-structure.

A silicide layers may be selectively formed in the first and second ends of the nano-structure. Each of the plurality of nano-structure may include a first diameter contacting the first conductive layer and a second diameter contacting the second conductive layer, and the first diameter may be smaller than the second diameter. A diameter of each nano-structure may be gradually decreased toward the first conductive layer along a length direction of the nano-structure. A high-concentrated doping area may be formed in the first end of the nano-structure, and the high-concentrated doping area may contact the first conductive layer.

The solar cell according to the exemplary embodiment of the present invention may further include a blocking layer disposed on the first conductive layer between the nano-structures and covering the high-concentrated p-type doping area. The solar cell according to the exemplary embodiment of the present invention may further include another dielectric layer disposed opposite to the dielectric layer, interposing the second conductive layer therebetween. The other dielectric layer may have a thickness of 0.5 mm to 30 mm. The dielectric layer and the other dielectric layer may respectively include polydimethylsiloxane (PDMS).

Each of the plurality of nano-structures may have concentration gradient along a length direction thereof. Each nano-structure may have a composition of $Si_{1-x}Ge_x$ ($0<x\leq0.5$), and x may be sequentially decreased as becoming close to the second conductive layer along the length direction of the nano-structure. Each of the plurality of nano-structures may have a composition of $Si_{1-x}Ge_x$ ($0<x\leq0.3$).

The solar cell according to the exemplary embodiment of the present invention may further include a transparent conductive layer covering the surface of the plurality of nano-structures and contacting the dielectric layer and the second conductive layer.

A manufacturing method of a solar cell according to another exemplary embodiment of the present invention includes: i) making a plurality of nano-structures extended in a direction that is perpendicular to a plate surface of a substrate grow through openings, the plurality of nano-structures formed in a mask layer disposed on the substrate; ii) filling the openings by plating a metal to a lower end of at least one of the plurality of nano-structures; iii) forming a silicide layer at the lower end of the nano-structure by thermally treating the nano-structure; iv) forming a plurality of doping areas in the nano-structure; v) providing a dielectric layer on the masker layer to couple the dielectric layer with the nano-structure; vi) separating the nano-structure coupled with the dielectric layer from the mask layer and the substrate; vii) forming a high-concentrated doping area in the nano-structure contacting the silicide layer; and viii) providing a first conductive layer and a second conductive layer respectively in bottom and front sides of the dielectric layer.

In the forming of the silicide layer, the silicide layer may be formed from coupling of the metal and a material of the substrate. A groove may be formed in the substrate as the silicide layer is formed, and the silicide layer may be fitted to the groove. The forming of the high-concentrated doping area may be formed by injecting boron (B) to the externally exposed nano-structure.

The manufacturing method of the other exemplary embodiment of the present invention may further include providing a metal nano-particle on a surface of the nano-structure after the forming of the plurality of doping areas in the nano-structure. The forming of the plurality of doping areas in the nano-structure may include i) forming a first doping area in the nano-structure and ii) forming a second doping area that surrounds the first doping area in a direction that is parallel with a plate surface of the substrate in the nano-structure. In the forming of the second doping area in the nano-structure, the second doping area may be formed in n-type.

The forming of the plurality of doping areas in the nano-structure may include i) forming a first doping area in the nano-structure and ii) forming a second doping area that is adjacent to the first doping area in a length direction of the nano-structure. The forming of the plurality of doping areas in the nano-structure may include i) forming a first doping area in the nano-structure; ii) forming an intrinsic area that is adjacent to the first doping area in a length direction of the nano-structure, and iii) forming a second doping area that is adjacent to the intrinsic area in the length direction of the nano-structure.

A manufacturing method of a solar cell according to another exemplary embodiment of the present invention includes: i) providing a plurality of nano-structures extended in a direction that is perpendicular to a plate surface of a substrate on the substrate; ii) providing a doping layer between the plurality of nano-structures; iii) providing a blocking layer on the doping layer; iv) doping surfaces of the plurality of nano-structures, and providing a high-concentrated doing area by doping first ends of the plurality of nano-structures contacting the substrate with the doping layer; v) providing a dielectric layer between the plurality of nano-structures on the substrate; vi) providing a first electrode covering second ends of the plurality of nano-structures exposed onto the dielectric layer; vii) providing another dielectric layer on the first electrode; viii) separating the substrate from the dielectric layer by breaking the other dielectric layer to externally expose the high-concentrated doping area; and ix) forming a second doping area that is adjacent to the intrinsic area in the length direction of the nano-structure.

In the providing of the plurality of nano-structures, the plurality of nano-structures may be formed by etching a base that forms the substrate. An etching area formed during the etching of the base may be gradually increased toward a plate surface of the substrate. The providing of the dielectric layer includes i) the dielectric layer covering the second ends of the plurality of nano-structures and ii) externally exposing the second ends by plasma-etching the dielectric layer that covers the second ends.

The manufacturing method of the present embodiment may further include forming a transparent conductive layer that covers surfaces of the plurality of nano-structures exposed onto the blocking layer after the providing of the high-concentrated doping area, and, in the providing of the first electrode, the transparent conductive layer may contact the first electrode. In the providing of the second electrode, the second electrode may be distanced from the transparent conductive layer by the blocking layer.

A manufacturing method of a solar cell according to another exemplary embodiment of the present invention includes: i) providing a substrate; ii) sequentially layering a plurality of compound semiconductive layers on the substrate; iii) providing an oxidative induction pattern on the plurality of compound semiconductive layers; iv) providing a plurality of nano-structures by partially etching the plurality of compound semiconductive layers; v) doping the plurality of nano-structures; vi) providing a dielectric layer between the plurality of nano-structures on the substrate; vii) providing a transparent conductive layer on the dielectric layer; viii) providing a first electrode on the transparent conductive layer; ix) separating the substrate from the plurality of nano-structures to externally expose first ends of the plurality of nano-structures; and x) providing a second electrode contacting the dielectric layer while covering the first ends.

The plurality of compound semiconductive layers may respectively have concentration gradients along a layering direction thereof. In the providing of the transparent conductive layer, the transparent conductive layer may cover second ends of the plurality of nano-structures exposed onto the dielectric layer.

The substrate can be recycled so that massive solar cells may be manufactured with low price. Accordingly, manufacturing efficiency of the solar cell can be enhanced. Since flexibility of the solar cell can be acquired using a dielectric layer, the solar cell may be applied to clothing, a flexible display, and the like. Further, advantages of an organic solar cell and a silicon solar cell can be used and therefore photovoltaic efficiency can be improved and a flexible characteristic can be acquired. In addition, the solar cell may be manufactured using silicon having low purity.

DETAILED DESCRIPTION OF THE EMBODIMENTS

Figure 1:
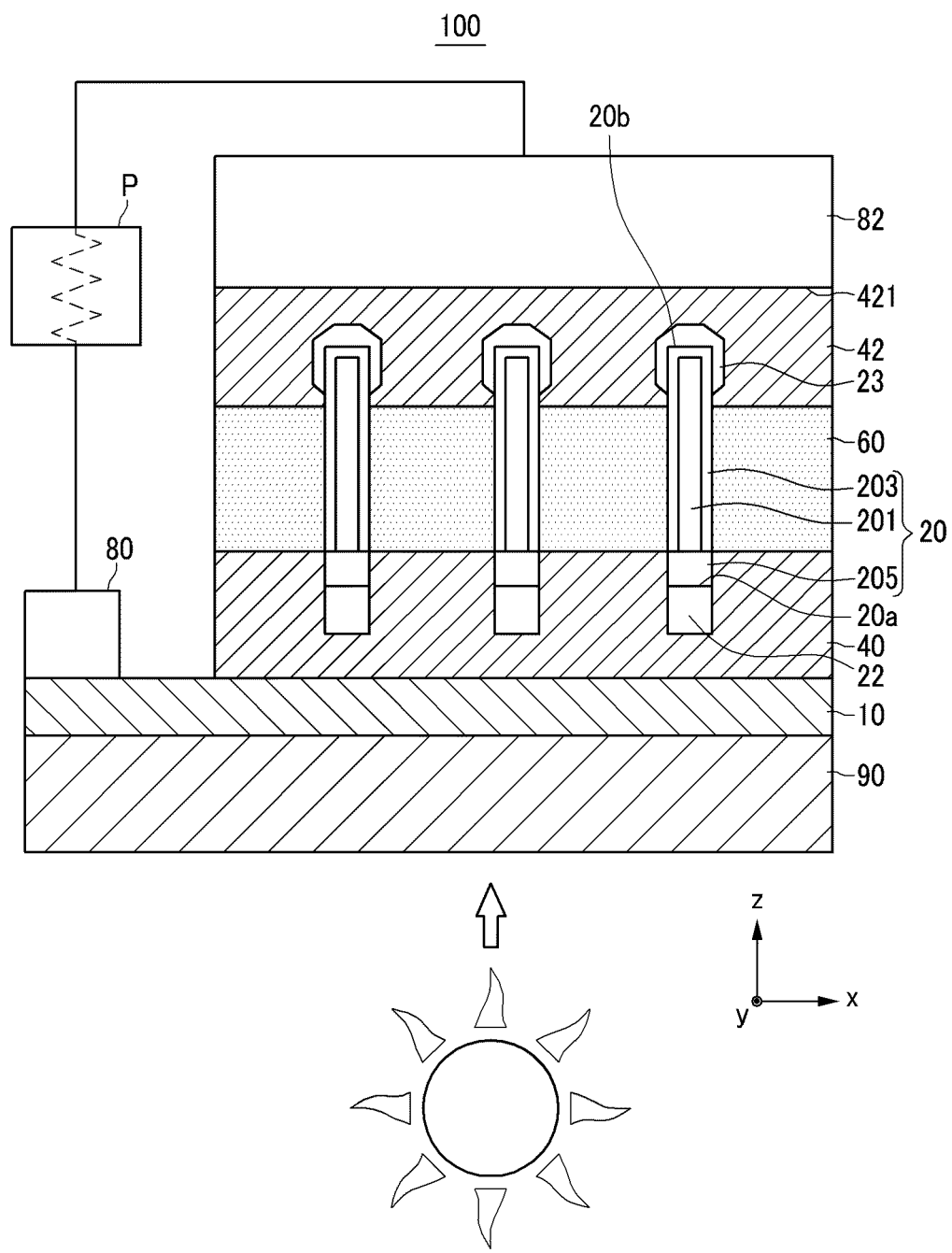
FIG. 1 is a schematic cross-sectional view of a solar cell according to a first exemplary embodiment of the present invention.

The present invention will be described more fully hereinafter with reference to the accompanying drawings, in which exemplary embodiments of the invention are shown. As those skilled in the art would realize, the described embodiments are provided only for examples of the present invention and may be modified in various different ways, all without departing from the spirit or scope of the present invention. The same of like parts are designated by reference numbers as the same as possible in the drawings.

All the terminologies including technical terms and scientific terms used herein have the same meanings that those skilled in the art generally understand. Terms defined in dictionaries are construed to have meanings corresponding to related technical documents and the present description and they are not construed as ideal or overly official meanings, if not so defined.

It will be understood that when an element is referred to as being "on" another element, it can be directly on another element or intervening elements may be present therebetween. In contrast, when an element is referred to as being "directly on" another element, there are no intervening elements therebetween.

It will be understood that, although the terms first, second, third, etc. may be used herein to describe various elements, components, regions, layers and/or sections, but are not limited thereto. These terms are only used to distinguish one element, component, region, layer or section from another element, component, region, layer, or section. Thus, a first element, component, region, layer, or section discussed below could be termed a second element, component, region, layer, or section without departing from the teachings of the present invention.

Terminologies used herein are provided to just mention specific exemplary embodiments and are not intended to limit the present invention. Singular expressions used herein include plurals unless they have definitely opposite meanings. The meaning of "including" used in this specification gives shape to specific characteristics, region, positive number, step, operation, element, and/or component, and do not except existence or addition of other specific characteristics, region, positive number, step, operation, element, component, and/or group.

Spatially relative terms, such as "below", "above", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Apparatuses may be otherwise rotated 90 degrees or by other angles and the spatially relative descriptors used herein are to interpreted accordingly.

It will be understood that the term "nano" used hereinafter implies a nano scale, and may include a micro unit. In addition, it will also be understood that the term "nanostructure" used hereinafter implies an object of the nano scale including all structures such as a nano rod, a nano tube, a nano wall, and a nano wire.

FIG. 1 is a schematic cross-sectional view of a solar cell 100 according to a first exemplary embodiment of the present invention. FIG. 1 exemplarily illustrates a structure of the solar cell 100, and the present invention is not limited thereto. Accordingly, the structure of the solar cell 100 may be variously modified.

As shown in FIG. 1, the solar cell 100 includes a plurality of nanostructures 20, a first conductive layer 40, a second conductive layer 42, and a dielectric layer 60. The solar cell 100 may further include other elements. For example, the solar cell 100 further includes a catalyst 50, transparent contact layer 10, light transmissive substrate 90 and contact portions 80 and 82.

In FIG. 1, the nanostructures 20 are formed in the shape of a nano-rod and extended along the z-axis direction, but the shape of the nanostructures 20 may be modified. The plurality of nano-structures 20 are respectively distanced from each other and extended in the z-axis direction so that they can effectively absorb sunlight.

The nano-structure 20 may be made of silicon (Si), germanium (Ge), or silicon germanium (SiGe). With use of such a material, a doping area may be formed in the nano-structure 20.

As shown in FIG. 1, each nano-structure 20 includes a first doping area 201 and a second doping area 203. The second doping area 203 surrounds the first doping area 201. Particularly, the second doping area 203 surrounds the first doping area 210 along a direction that is parallel with a plate surface 421 of the second conductive layer 42, that is, the x-y plane direction. Here, the first doping area 201 may be formed as an n-type and the second doping area 203 may be formed as a p-type. Thus, when electrons are coupled to the first doping area 201 and holes are coupled to the second doping area 203 by the incident sunlight, an photovoltaic power is generated. Since the nano-structure 20 directly contacts the second conductive layer 42 and the dielectric layer 60, the nano-structure 20 can be prevented from experiencing a short-circuit due to electrical connection with the first conductive layer 40.

As shown in FIG. 1, a silicide layer 22 is formed in a first end 20a of the nano-structure 20. A silicide layer 23 formed in a second end 20b of the nano-structure 20 functions as a catalyst for growth of the nano-structure 20.

In manufacturing of the solar cell 100, a part of the silicide layer 22 may function as the silicide layer 23 that is a catalyst for manufacturing of the nano-structure 20. Accordingly, the solar cell 100 can be continuously manufactured by recycling a substrate 70 (refer to FIG. 6) so that manufacturing cost of solar cell 100 can be reduced. This will be described in further detail later.

As shown in FIG. 1, a p-type doping area 205 having a high concentration, that is, a p+ type doping area is formed in the nano-structure 20 that contacts the silicide layer 22. As a result, holes generated from the nano-structures 20 by the incident sunlight can be efficiently transmitted to a transparent contact layer 10 through the p+ type doping area 205, photovoltaic efficiency of the solar cell 100 can be enhanced. Furthermore, the p+ type doping area 205 is located in the first conductive layer 40 so that transfer efficiency of the holes can be enhanced through the first conductive layer 40.

As shown in FIG. 1, the first conductive layer 40 and the second conductive layer 42 are distanced from each other. The dielectric layer 60 is disposed between the first conductive layer 40 and the second conductive layer 42 to insulate the first conductive layer 40 and the second conductive layer 42 from each other. For example, zinc oxide (ZnO), silicon oxide ($SiO_2$), polydimethylsiloxane (PDMS), or a mixture thereof may be used as a material of the dielectric layer 60.

The first conductive layer 40 covers the first end 20a of the nano-structure 20 and the second conductive layer 42 covers the second end 20b of the nano-structure 20. Here, the first conductive layer 40 and the second conductive layer 42 may be formed with transparent conductive oxide (TCO) for efficiency light transmission. As a result, sunlight is transmitted through the first and second conductive layers 40 and 42 and then incident on the plurality of nano-structures 20. Accordingly, light absorption capability of the solar cell 100 can be improved.

As shown in FIG. 1, a transparent contact layer 10 is disposed contacting the first conductive layer 40 and light transmissive substrate 90. Thus, the light transmissive substrate 90 can directly transmit sunlight passed through glass to the nano-structure 20 rather than blocking the same. For example, the transparent contact layer 10 includes indium tin oxide (ITO) so that it can electrically connect the first conductive layer 40 and a first contact portion 80 while transmitting light.

As shown in FIG. 1, a second contact portion 82 and the first contact portion 80 are respectively formed in an upper portion of the second conductive layer 42 and an upper portion of the transparent contact layer 10 and they are connected with a passive element P. Thus, the passive element P is supplied with power using the solar cell 100 and thus the passive element P can be driven.

Figure 2:
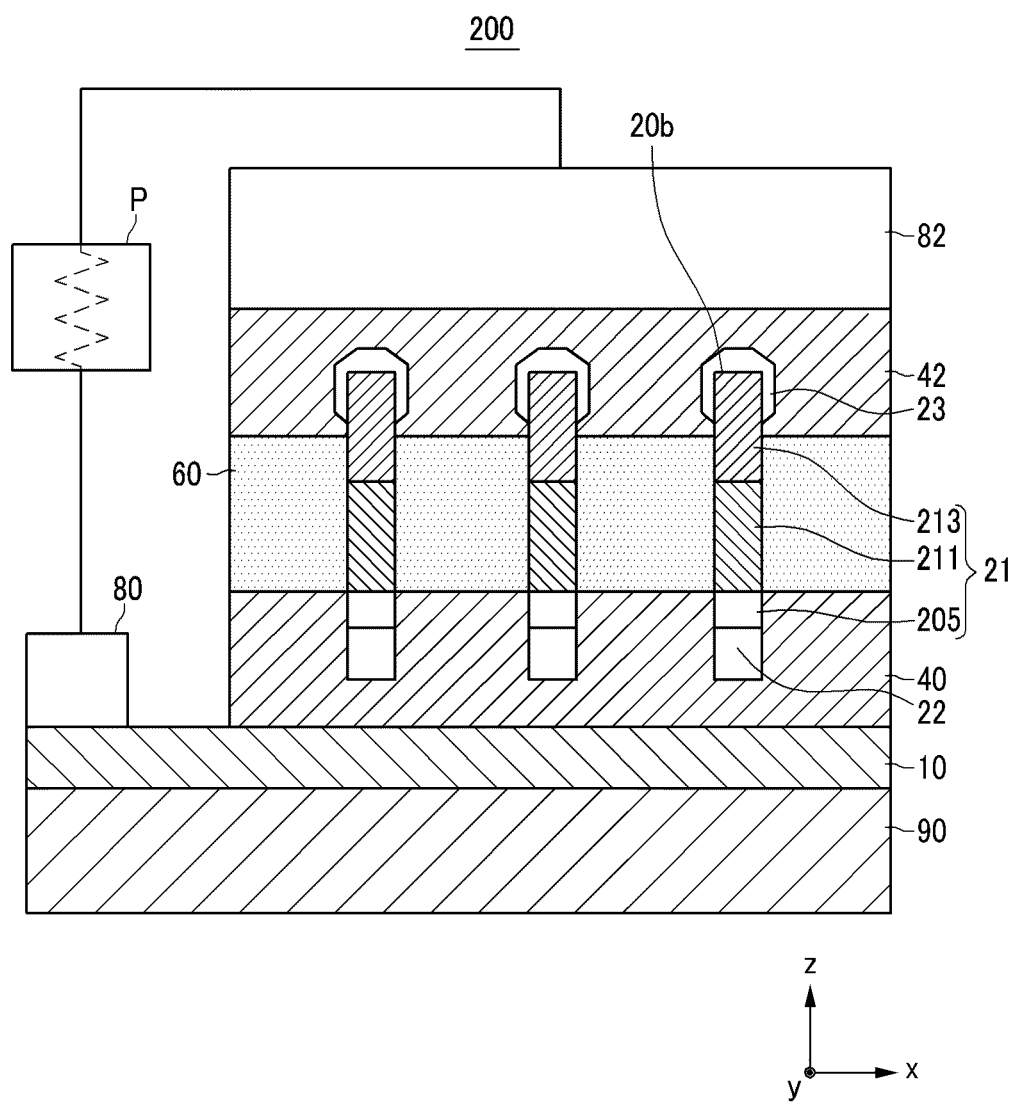
FIG. 2 is a schematic cross-sectional view of a solar cell according to a second exemplary embodiment of the present invention.

FIG. 2 is a schematic cross-sectional view of a solar cell 200 according to a second exemplary embodiment of the present invention. Since a structure of the solar cell 200 of FIG. 2 is similar to the structure of the solar cell 100 of FIG. 1, identical parts are denoted by the same reference symbols, and a detailed description thereof is omitted.

As shown in FIG. 2, a nano-structure 21 includes a first doping area 211 and a second doping area 213 formed along a length direction of the nano-structure 21, that is, the z-axis direction. The first doping area 211 and the second doping area 213 are adjacent to each other along the z-axis direction. Here, the first doping area 211 may be formed as an n type and the second doping area 213 may be formed as a p type. Thus, when electrons are coupled to the first doping area 211 and holes are coupled to the second doping area 213 by the incident sunlight, an photovoltaic power is generated. Although it is not illustrate in FIG. 2, a p+/p/n/n+ type doping area or a p+/p/i/n/n+ type doping area may be formed along a length direction of the nano-structure 21.

Figure 3:
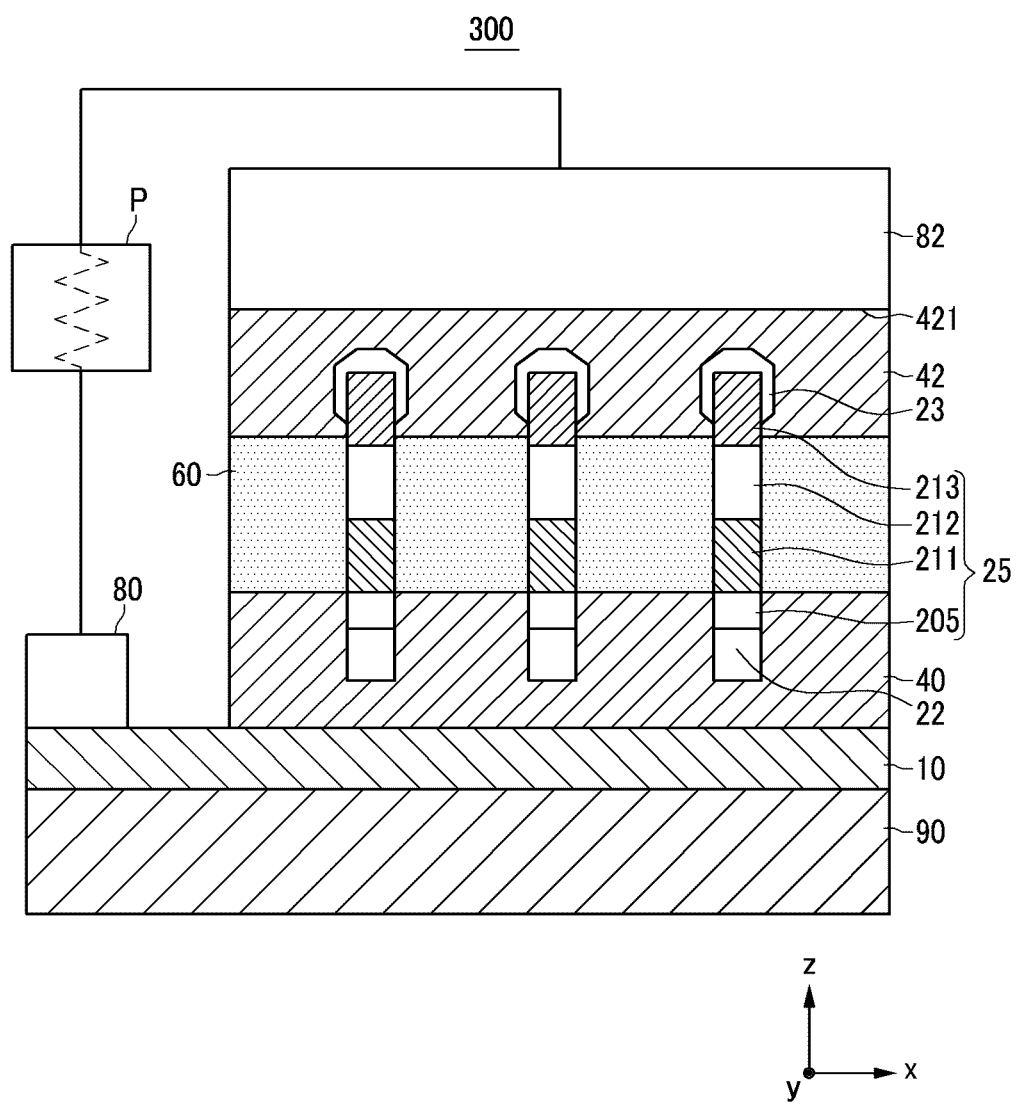
FIG. 3 is a schematic cross-sectional view of a solar cell according to a third exemplary embodiment of the present invention.

FIG. 3 is a schematic cross-sectional view of a solar cell 300 according to a third exemplary embodiment of the present invention. Since a structure of the solar cell 300 of FIG. 3 is similar to the structure of the solar cell 200 of FIG. 2, identical parts are denoted by the same reference symbols, and a detailed description thereof is omitted.

As shown in FIG. 3, a nano-structure 25 includes a first doping area 211, an intrinsic area 212, and a second doping area 213 arranged along a length direction thereof. The first doping area 211, the intrinsic area 212, and the second doping area 213 contact each other. A band gap of the nano-structure 25 can be minimized by forming the intrinsic area 212 between the first doping area 211 and the second doping area 213. As a result, holes and free electrons transfer efficiency is increased through the nano-structure 25 such that photovoltaic efficiency of the solar cell 300 can be increased.

Figure 4:
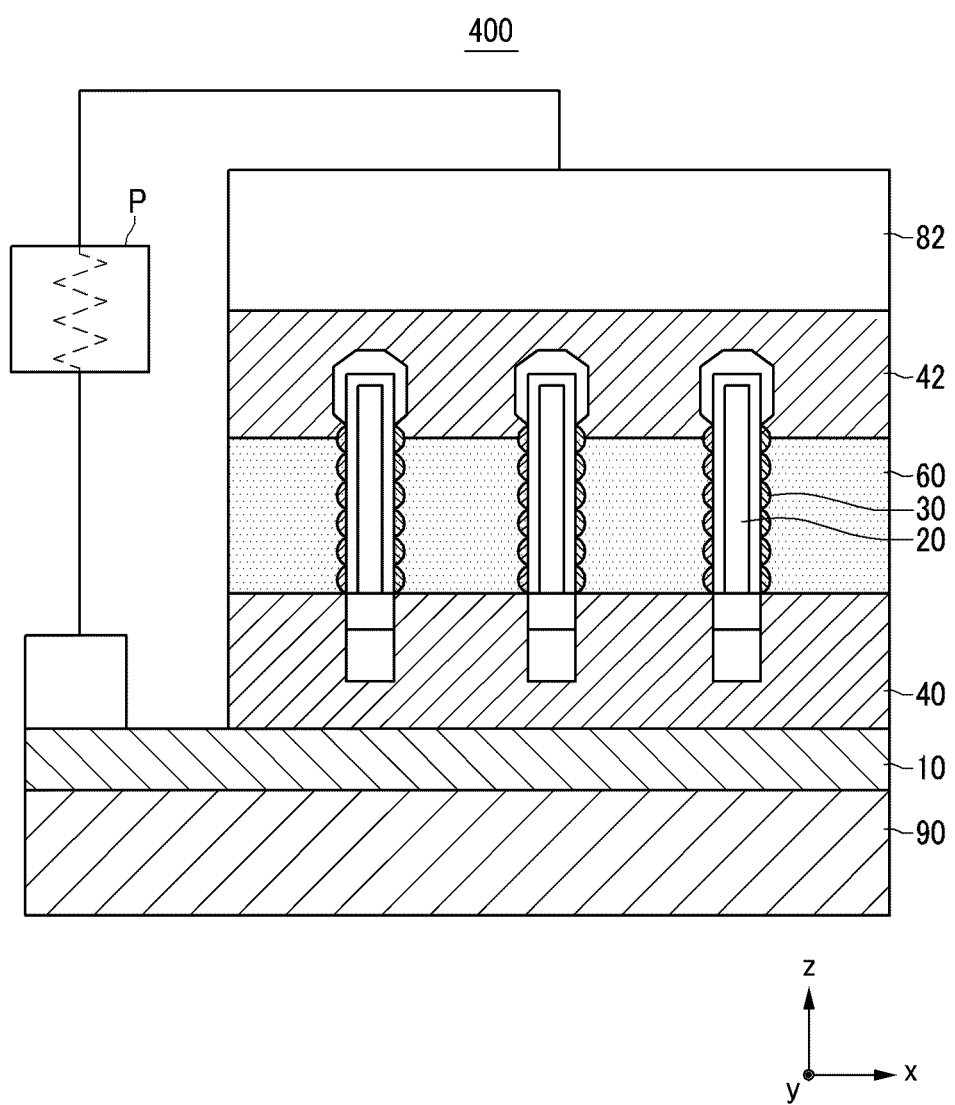
FIG. 4 is a schematic cross-sectional view of a solar cell according to a fourth exemplary embodiment of the present invention.

FIG. 4 is a schematic cross-sectional view of a solar cell 400 according to a fourth exemplary embodiment of the present invention. Since a structure of the solar cell 400 of FIG. 4 is similar to the structure of the solar cell 100 of FIG. 1, identical parts are denoted by the same reference symbols, and a detailed description thereof is omitted.

As shown in FIG. 4, the solar cell 400 further includes a metal nano-particle 30. The metal nano-particle 30 can further maximize a surface plasmon effect by contacting the dielectric layer 60. As a result, light absorption of the solar cell 400 can be further improved.

The metal nano-particle 30 is disposed on the surface of the nano-structure 20. The metal nano-particle 30 having a hemisphere shape is attached to the surface of the nano-structure 20 to induce the surface Plasmon effect. A plasmon is quasi particles having collective oscillation of free electrons on a metal surface, and partially exists at a surface of the metal nano-particle 30.

Thus, a visible ray area has high transmittance with a plasmon effect using the metal nano-particle 30. As a result, light absorption of the solar cell 400 can be significantly enhanced. For example, a material having an excellent surface Plasmon effect such as silver (Ag), gold (Au), aluminum (Al), copper (Cu), nickel (Ni), or an alloy thereof may be used for the metal nano-particle 30. Such a material of the metal nano-particle 30 has an excellent surface Plasmon effect, and therefore it is appropriate to be used for the solar cell 400.

Figure 5:
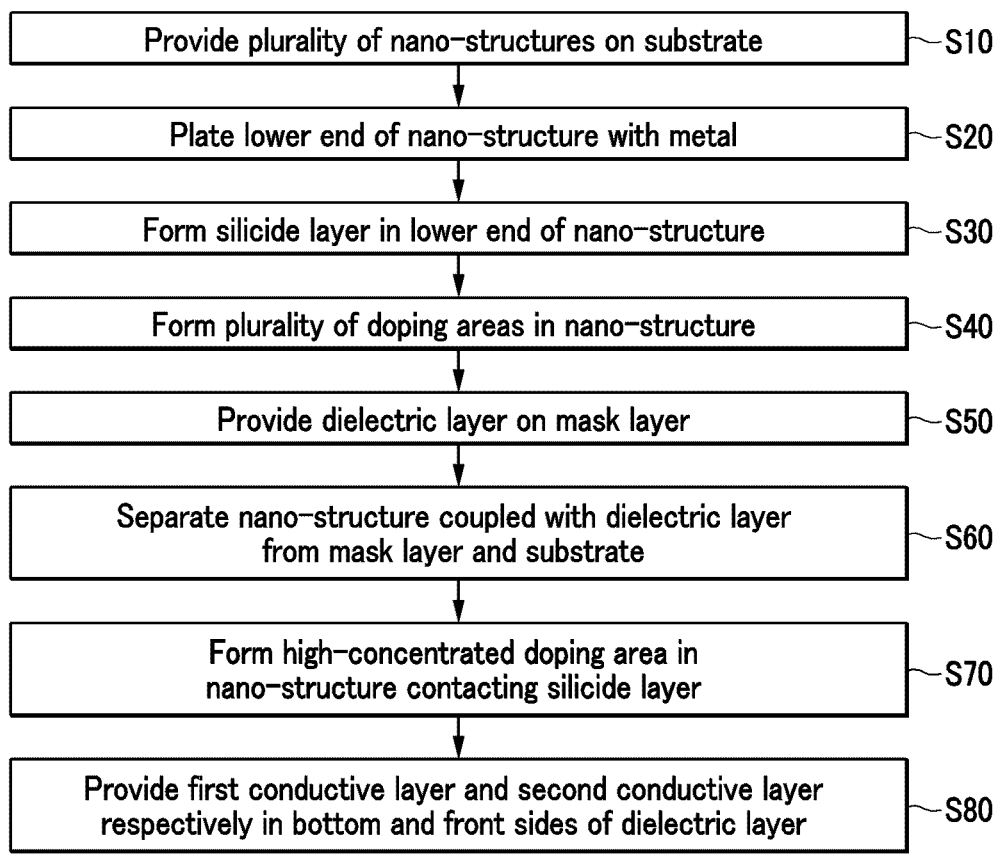
FIG. 5 is a schematic flowchart of a manufacturing process of the solar cell of FIG. 1.

FIG. 5 schematically illustrates a flowchart of a manufacturing process of the solar cell 100 of FIG. 1, and FIG. 6 to FIG. 13 respectively show each step of the manufacturing process of the solar cell 100 of FIG. 1. Hereinafter, a manufacturing process of a portion where the first conductive layer 40, the second conductive layer 42, and the dielectric layer 20 are coupled to each other in the solar cell 100 of FIG. 1 will be sequentially described with reference to FIG. 5 and FIG. 6 to FIG. 13. A manufacturing process of the solar cell 100, excluding the above-stated portion is well known to a person skilled in the art, and therefore no further description will be provided.

Figure 6:
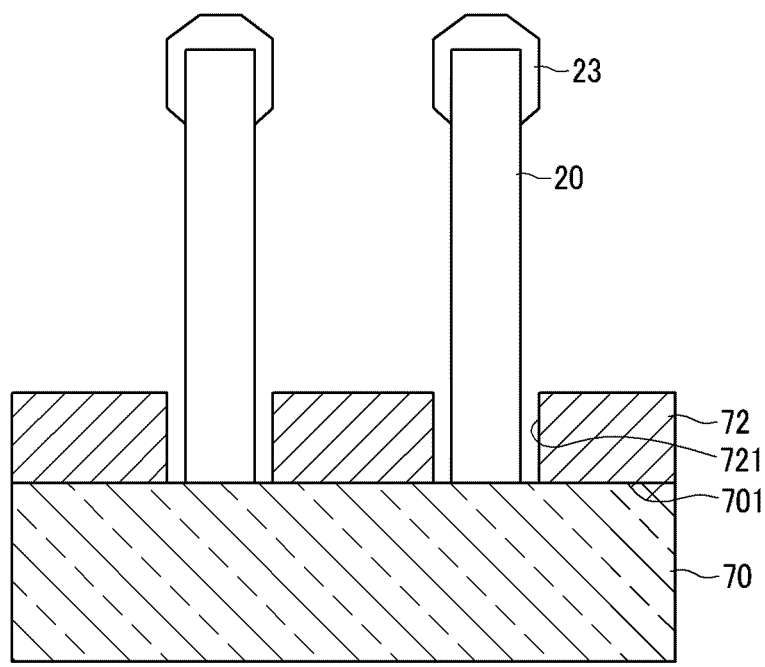
FIG. 6 to FIG. 13 respectively show manufacturing processes of the solar cell corresponding to the respective steps of FIG. 5.

First, as shown in FIG. 6, in step of S10 of FIG. 5, the plurality of nano-structures 20 are grown on the substrate 70 through a mask layer 72 disposed on the substrate 70. Since a plurality of openings 721 are formed in the mask layer 72, growth of the plurality of nano-structures 20 can be performed through the plurality of openings 721. The plurality of nano-structures 20 are extended in a direction that is substantially perpendicular to a plate surface 701 of the substrate 70.

The plurality of nano-structures 20 are manufactured by injecting a precursor into a chamber (not shown) using the silicide layer 23 as a catalyst. Here, highly doped p-type silicon may be used as a material of the substrate 70, and silicon oxide (SiO$_2$) may be used as a material of the mask layer 72. Further, for example, a nickel silicide (NiSi$_x$) may be used as a material of the silicide layer 23. The nano-structure 20 may be manufactured with silicon.

Figure 7:
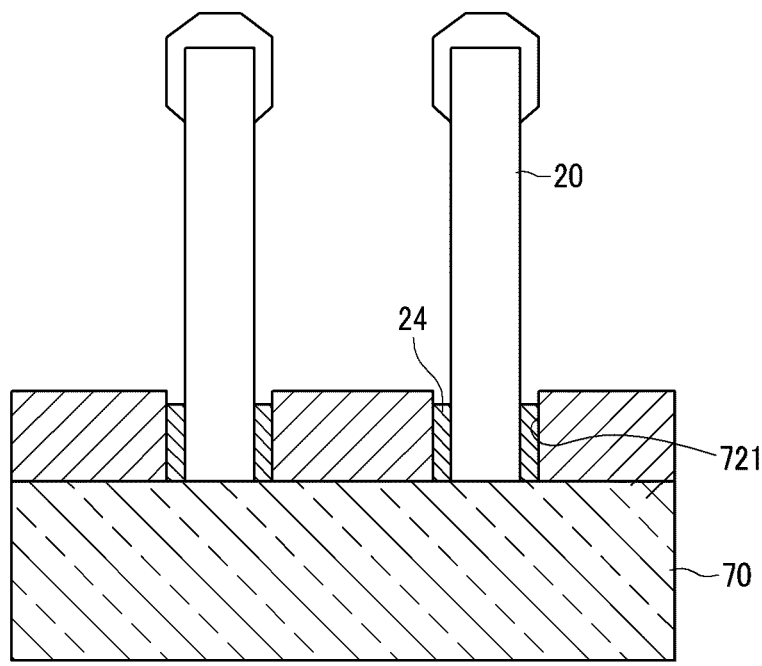

Next, in step S20 of FIG. 5, a metal 24 is plated to a lower end of the nano-structure 20 so as to fill the openings 721. For example, as shown in FIG. 7, the lower end of the nano-structure 20 is filled by electrolessly plating the metal 24 such as nickel thereto.

Figure 8:
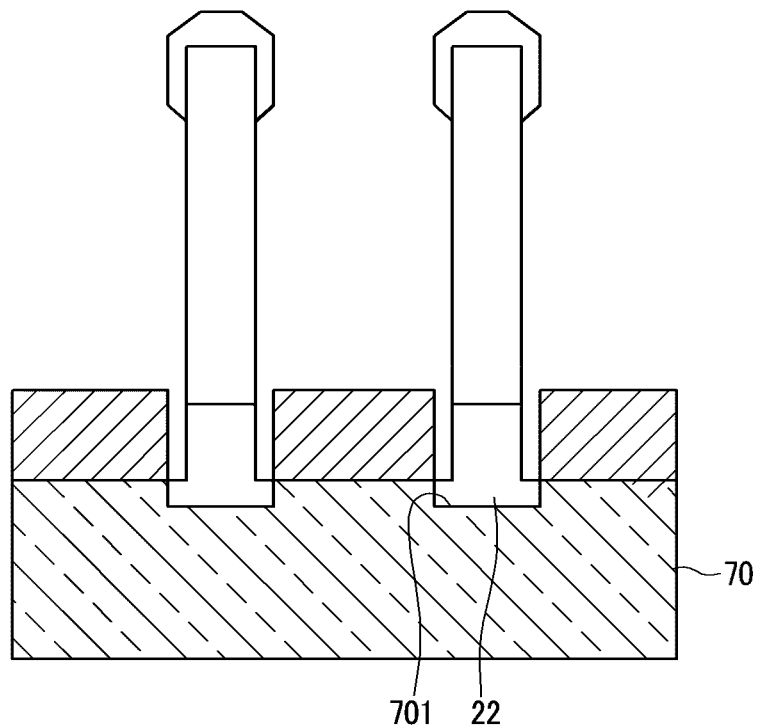

In step of S30 of FIG. 5, the silicide layer 20 is formed at the lower end of the nano-structure 20 by thermally treating nano-structure 20. That is, as shown in FIG. 8, the silicide layer 22 is formed at the lower end of the nano-structure 20 through interaction between the substrate 20 and the metal 24 (refer to FIG. 7). The silicide layer 22 is formed by coupling of the metal 24 (shown in FIG. 7) and silicon, which is a material of the substrate 70. Thus, the silicide layer 22 can be formed using a part of the material of the substrate 70 and therefore a groove 701 is formed in the substrate 70. In addition, the silicide layer 22 is inserted in the groove 701.

Figure 9:
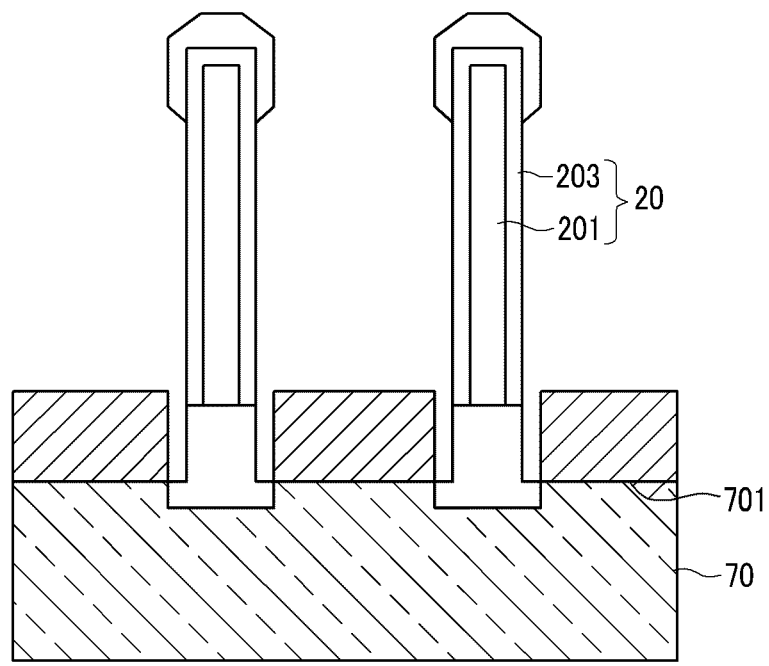

In step of S40 of FIG. 5, the plurality of doping areas 201 and 203 are formed in the nano-structure 20. As shown in FIG. 9, the plurality of doping areas 201 and 203 include the first doping area 201 and the second doping area 203.

In order to form the first doping area 201, boron may in injected into the nano-structure 20 by coating the boron thereto. In this case, the boron coated to the surface of the nano-structure 20 is dispersed into the nano-structure 20 by heat such that the entire nano-structure 20 is changed to the first doping area 201. Accordingly, the nano-structure 20 uniformly doped to the first doping area 201 can be manufactured.

Next, phosphorus (P) is injected to the nano-structure 20 while thermally treating the nano-structure 20 where the first doping area 201 is formed. That is, when thermal treatment is performed on the nano-structure 20 after coating phosphorus to the surface of the nano-structure 20, phosphorus is dispersed to the nano-structure 20. In addition, the nano-structure 20 injected with phosphorus is plasma-ion doped to form the second doping area 203. As a result, while an external area of the first doping area 201 is changed to the second doping area 203, the second doping area 203 surrounds the first doping area 201 along a direction that is parallel with the plate surface 701 of the substrate 70. Free electrons transfer efficiency can be enhanced by forming the second doping area 203 as an n-type. Meanwhile, in order to prevent the first doping area 201 from being wholly changed to the second doping area 203, thermal treating time of the nano-structure 20 for forming the second doping area 203 is maintained to be shorter than thermal treating time of the nano-structure 20 for the first doping area 201.

Unlikely, in step S40 of FIG. 5, the first and second doping areas 211 and 213 may be formed along the length direction of the nano-structure 20 as shown in FIG. 2 and FIG. 3. In this case, both ends of the nano-structure 20 are doped and dispersed to form a pn junction structure or a pin junction structure before forming the conductive layers 40 and 42. Here, the pin junction structure includes a non-doped intrinsic area.

The nano-structure 20 is doped in the state that the dielectric layer 60 functioning as a mask is formed. An organic material including phosphorus (P) and boron (B) are deposited by spin coating to both ends of the nano-structure 20 and they are simultaneously thermally treated such that the first doping area 211 and the second doping area 213 may be formed. Unlikely, both ends of the nano-structure 20 may be respectively doped to a p type and an n type through ion junction and then dispersed using thermal treatment to form pn junction or pin junction.

Meanwhile, the metal nano-particle 30 (shown in FIG. 4) may be provided on the surface of the nano-structure 20. In this case, the metal nano-particle 30 may be deposited on the surface of the nano-structure 20 using a target source (e.g., silver (Ag)) in a chamber (not shown).

Unlikely, the metal nano-particle 30 may be provided on the surface of the nano-structure 20 by dipping the nano-structure 20 in a plating bath (not shown). The metal nano-particle 30 is attached on the surface of the nano-structure 20 using electroless plating. When the nano-structure 20 is dried, the metal nano-particle 30 is attached in the shape of a hemisphere on the surface of the nano-structure 20.

Figure 10:
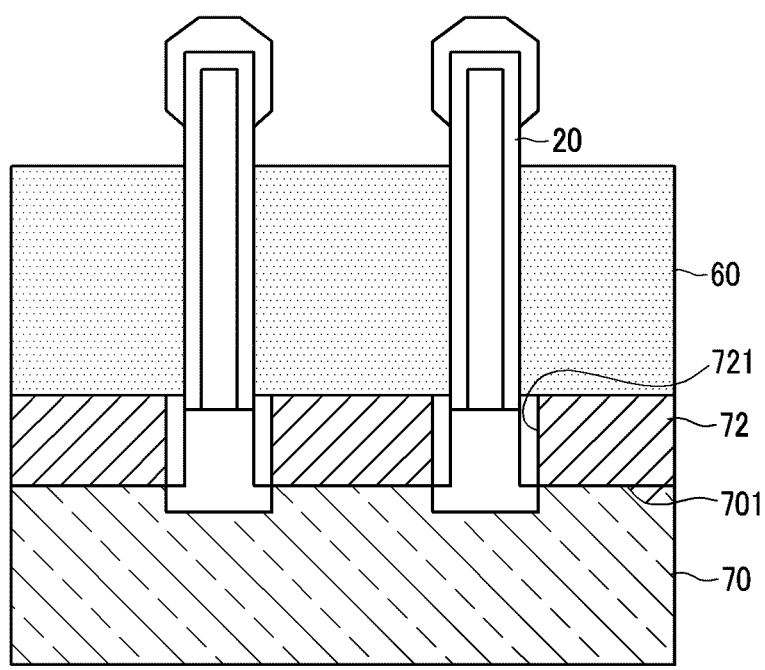

Next, in step S50 of FIG. 5, the dielectric layer 60 is coupled with the nano-structure 20 by providing the dielectric layer 60 on the mask layer 72 as shown in FIG. 10. Here, a material having a high thermosetting property, such as PDMS, is used to form the dielectric layer 60, and therefore the dielectric layer 60 is supported by the mask layer 72 and does not enter into the opening 721. Thus, a boundary is formed along a direction that is parallel with the plate surface 701 of the substrate 70 between the mask layer 72 and the dielectric layer 60.

Figure 11:
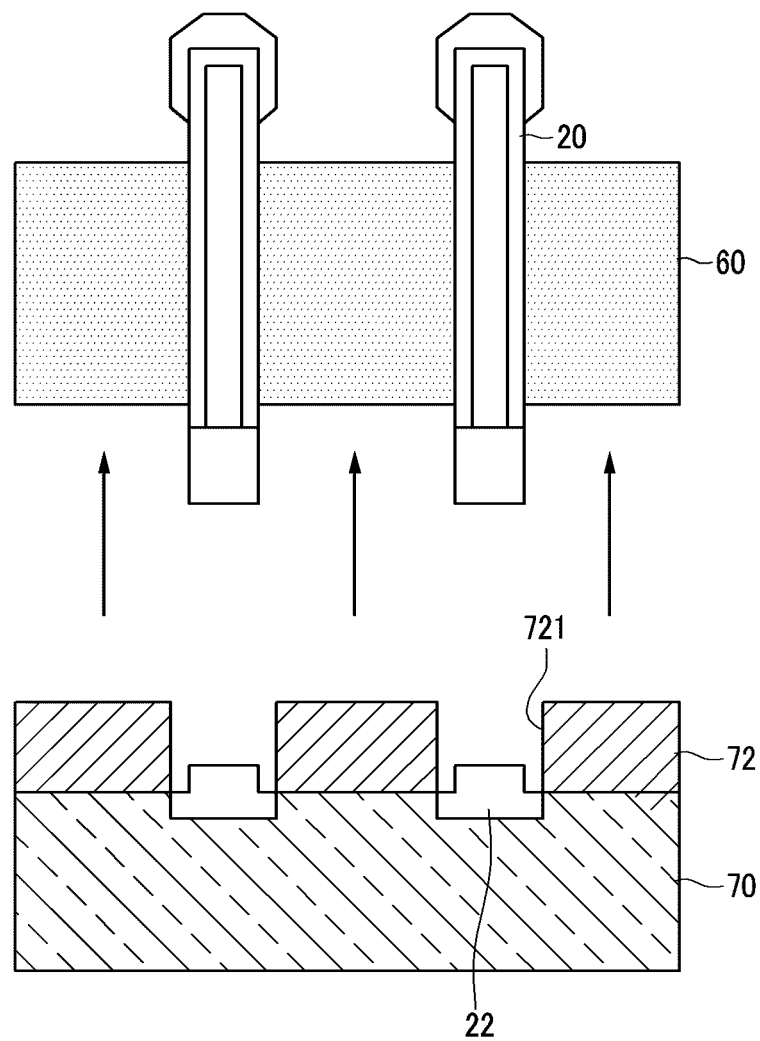

Next, in step S60 of FIG. 5, the nano-structure 20 coupled with the dielectric layer 60 is separated from the mask layer 72 and the substrate 70 as shown in FIG. 11. Here, the nano-structure 20 coupled with the dielectric layer 60 may only be used to manufacture the solar cell 100 (shown in FIG. 1).

A residual silicide layer 22 exists in the opening 721 of the substrate 70 separated from the nano-structure 20. Thus, the mask layer 72 may recycle the substrate 70 disposed thereon. That is, the substrate 70 is inserted in the chamber (not shown) and a precursor is injected therein, the residual silicide layer 22 functions as a catalyst such that the nano-structure 20 may be manufactured through the opening 721. As a result, manufacturing cost of the solar cell 100 (shown in FIG. 1) can be reduced by continuous recycling of the substrate 70.

Figure 12:
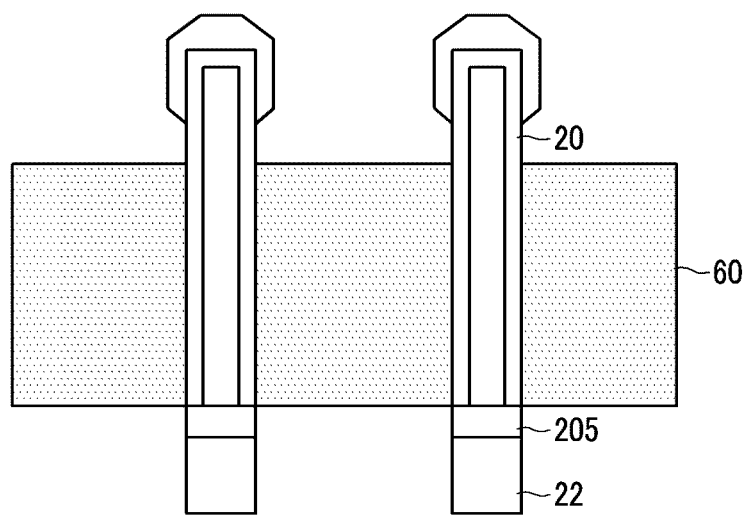

Next, in step S70 of FIG. 5, a doping area having high concentration, that is a p+ doping area 205 is formed in the nano-structure 20 that contacts the silicide layer 22 as shown in FIG. 12. That is, the p+ doping area 205 may be formed by injecting and dispersing boron (B) to one end of the nano-structure 20. As a result, transfer efficiency of the holes can be enhanced through the p+ doping area 205.

Figure 13:
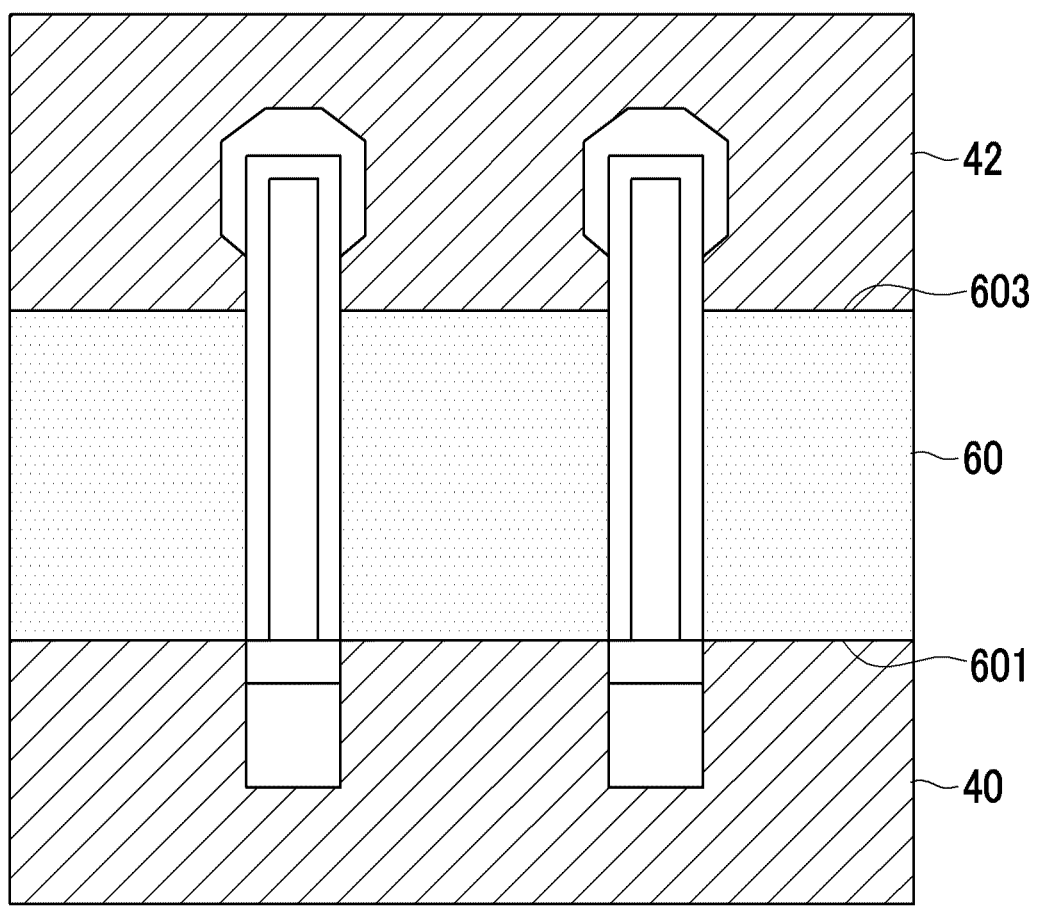

In step S80 of FIG. 5, the first conductive layer 40 and the second conductive layer 42 are respectively provided to a bottom side 601 and a front side 603 of the dielectric layer 60 as shown in FIG. 13. Thus, the dielectric layer 60 disposed to contact the first conductive layer 40 and the second conductive layer 42. The first conductive layer 40 and the second conductive layer 42 may be formed by spin-coating the dielectric layer 60. With the methods, the solar cell 100 (shown in FIG. 1) that can recycle the substrate 70 can be manufactured.

Figure 14:
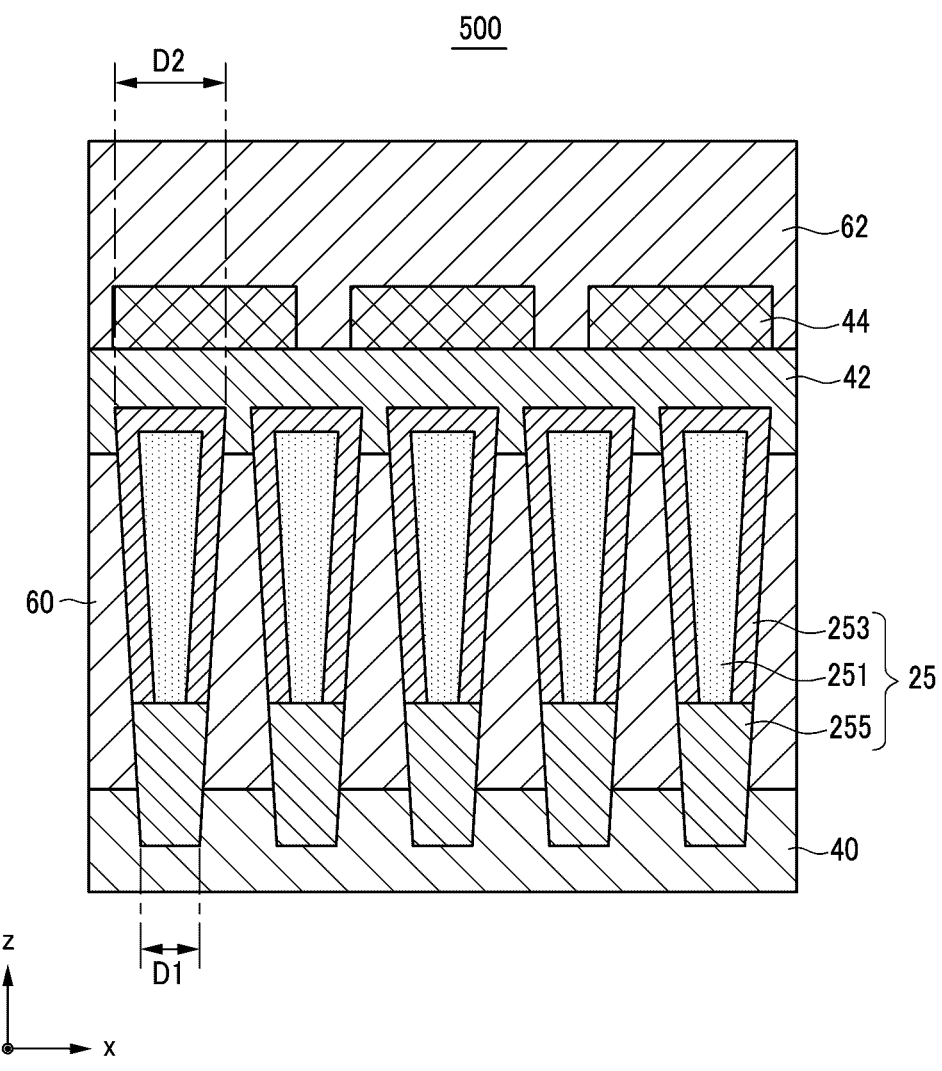
FIG. 14 is a schematic cross-sectional view of a solar cell according to a fifth exemplary embodiment of the present invention.

FIG. 14 schematically shows a cross-sectional structure of a solar cell 500 according to a fifth exemplary embodiment of the present invention. A structure of the solar cell 500 of FIG. 14 is similar to that structure of the solar cell 100 of FIG. 1, identical parts are denoted by the same reference symbols, and a detailed description thereof is omitted.

As shown in FIG. 14, the solar cell 500 includes a plurality of nano-structures 25, a first conductive layer 40, a second conductive layer 42, a metal grid 44, a first dielectric layer 60, and a second dielectric layer 62. The nano-structure 25 includes a first doping area 251, a second doping area 253, and a p-type doping area 255 having high concentration. The above-stated elements may be partially omitted in the solar cell 500. In addition, other elements may be further added to the solar cell 500.

As shown in FIG. 14, the nano-structure 25 has an inverse trapezoid shape. Thus, a diameter of the nano-structure 25 is gradually reduced as a distance between the nano-structure 25 and the first conductive layer 40 is decreased along a length direction of the nano-structure 25, that is, the z-axis direction. In addition, a first diameter D1 of the nano-structure 25 contacting the first conductive layer 40 is smaller than a second diameter D1 of the nano-structure 25 contacting the second conductive layer 42. Since the nano-structure 25 has such a structure, the nano-structure 25 can be easily separated from a substrate (not shown). That is, an area where the nano-structure 25 contacts the substrate (not shown) is small, and therefore the nano-structure 25 can be easily separated.

As shown in FIG. 14, a p-type doping area 255 having high concentration is formed at one end of the nano-structure 25. In this case, the first doping area 251 is formed as a p type and the second doping area 253 is formed as an n type. As a result, pn junction is realized in the nano-structure 25 such that a sufficient photovoltaic power can be generated with sunlight. The p-type doping area 255 having high concentration contacts the first conductive layer 40. Therefore, the p-type doing area 255 having high concentration can effectively transfer electrons or holes for generating electricity to the first conductive layer 40.

The second dielectric layer 62 is disposed on the metal grid 44 and the second conductive layer 42. That is, the second dielectric layer 62 is disposed opposite to the first dielectric layer 60, interposing the second conductive layer 42 therebetween. The second dielectric layer 62 may have a thickness of 0.5 mm to 30 mm. When the thickness of the second dielectric layer 62 is too small, a silicon wire array in a lower portion thereof cannot be supported. Further, when the thickness of the second dielectric layer 62 is too large, the solar cell 500 cannot be easily bent. Thus, the thickness of the second dielectric layer 62 is maintained in the above-stated range. The plurality of nano-structures 25 may be separated from the substrate (not shown) by breaking the second dielectric layer 62.

The first dielectric layer 60 and the second dielectric layer 62 may include PDMS. PDMS is an organic material supporter that makes the solar cell 500 easily bent. Accordingly, the solar cell 500 can be easily attached to an external side of a curved building. Hereinafter, a manufacturing method of the solar cell 500 will be described in further detail with reference to FIG. 15 and FIG. 16 to FIG. 24.

Figure 15:
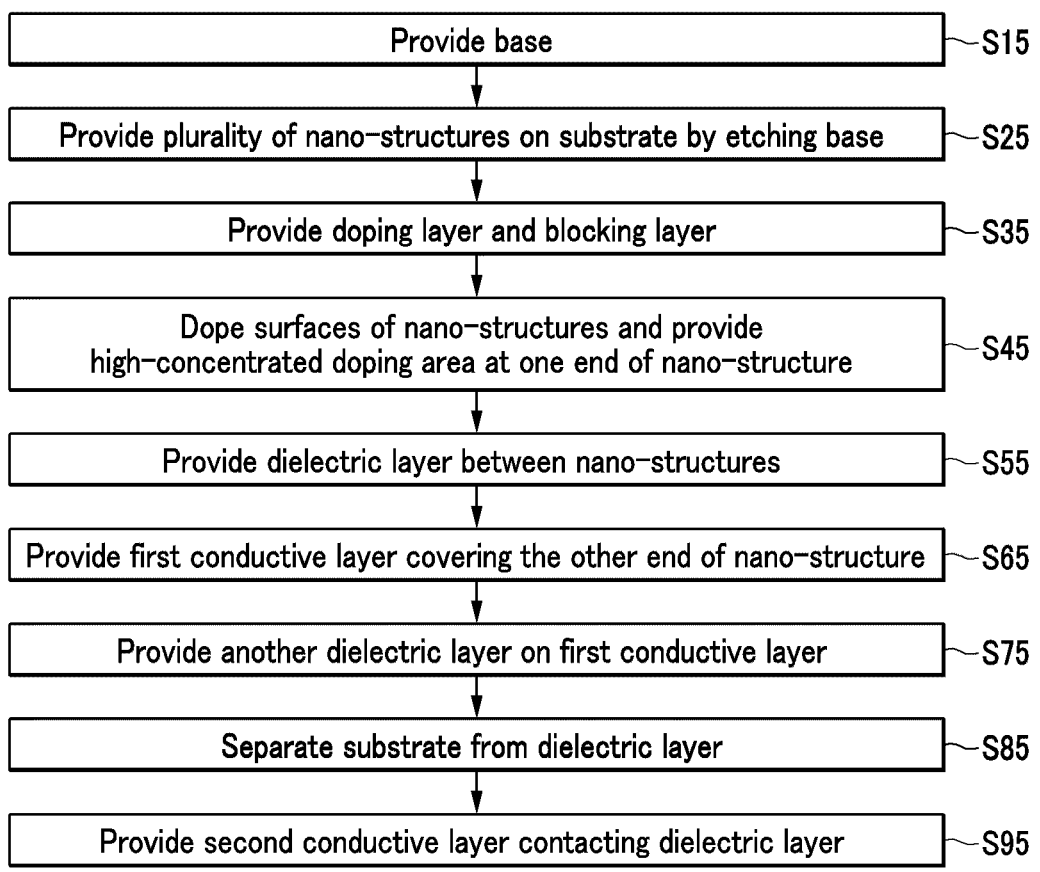
FIG. 15 is a schematic flowchart of a manufacturing process of the solar cell of FIG. 14.

FIG. 15 is a schematic flowchart of a manufacturing method of the solar cell 500 of FIG. 14, and FIG. 16 to FIG. 24 are cross-sectional views of the solar cell 500 corresponding to respective steps of FIG. 15.

As shown in FIG. 15, the manufacturing method of the solar cell 500 includes: i) providing a base (S15); ii) providing a plurality of nano-structures on a substrate by etching the base (S25); iii) providing a doping layer and a blocking layer (S35); iv) doping surfaces of the plurality of nano-structures and providing a doping area having high concentration at one end of the nano-structure (S45); v) providing a dielectric layer between the plurality of nano-structures (S55); vi) providing a first conductive layer that covers the other end of the nano-structure (S65); vii) providing another dielectric layer on the first conductive layer (S75); viii) separating a substrate from the dielectric layer (S85); and ix) providing a second conductive layer contacting the dielectric layer (S95). In addition to this, the manufacturing method of the solar cell 500 may further include other steps as necessary.

Figure 16:
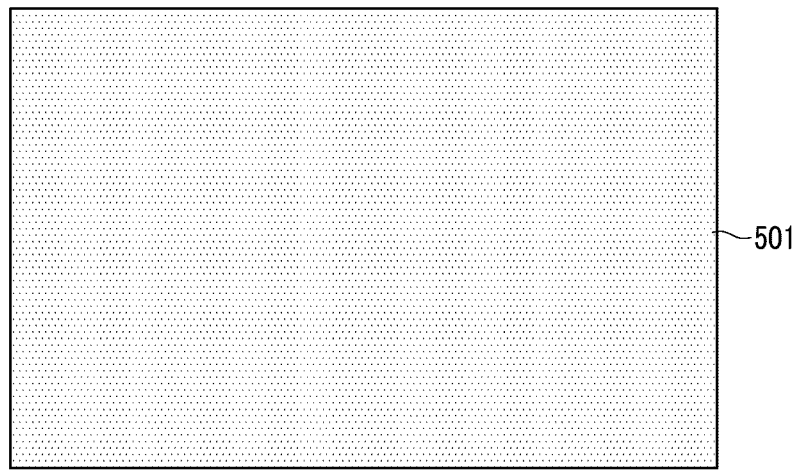
FIG. 16 to FIG. 24 respectively show manufacturing processes of the solar cell corresponding to the respective steps of FIG. 15.

As shown in FIG. 15, a base 501 is provided in step S15. For example, as shown in FIG. 16, p-type silicon may be used as a material of the base 501.

Figure 17:
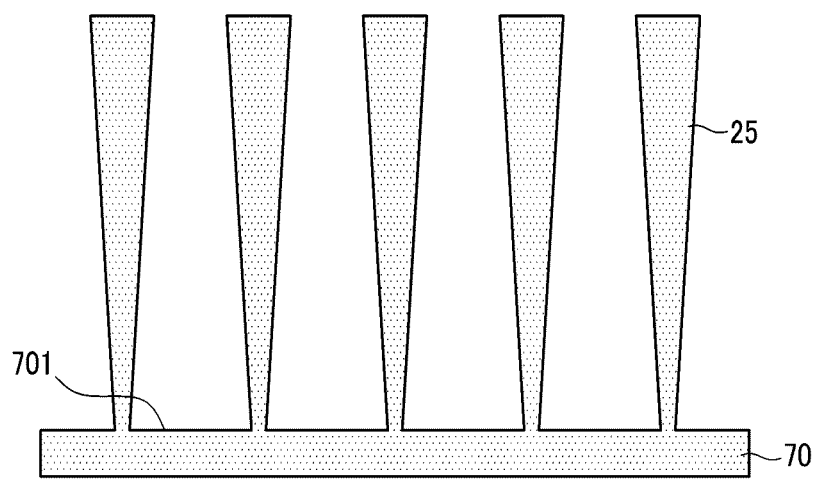

Next, a plurality of nano-structures 25 are provided on a substrate 70 by etching the base 501 in step S25 of FIG. 15. That is, as shown in FIG. 17, the plurality of nano-structures 25 are formed while anisotropic-etching the base 501 using a mask. Thus, etching areas disposed between the plurality of nano-structures are increased in size as a distance with the substrate 70 is decreased. Thus, the nano-structure 25 has an inverse trapezoid shape. Here, the plurality of nano-structures 25 extend in a direction that is substantially perpendicular to a plate surface 701 of the substrate 70. A diameter of nano-structure 25 may be 2 μm to 10 μm. When the diameter of the nano-structure 25 is too small, pn junction is unstable. When the diameter of the nano-structure 25 is too large, density of the nano-structure 25 is decreased such that light absorption and photovoltaic efficiency are decreased.

Figure 18:
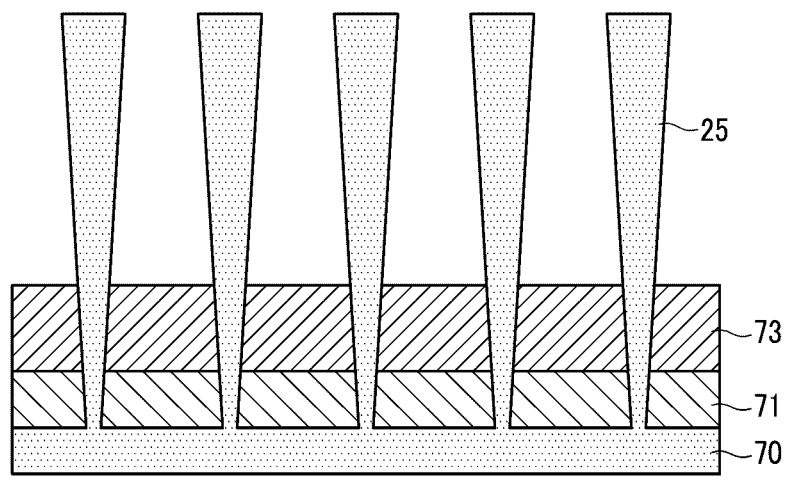

In step S35 of FIG. 15, a doping layer 71 and a blocking layer 73 are provided. That is, as shown in FIG. 18, the doping layer 71 and the blocking layer 73 are sequentially formed between the plurality of nano-structures 25 on the substrate 70. The doping layer 71 is provided to form a highly concentrated doping area at a lower end of the nano-structure 25. For example, the doping layer 71 is provided using a boron spin on dopant (SOD) method.

The blocking layer 73 is provided on the doping layer 71. The blocking layer 73 prevents an area highly doped by the doping layer 71, for example, phosphorus (p), from being dispersed to an upper portion of the nano-structure 25. The blocking layer 73 may be spin on glass (SOG)-coated.

Figure 19:
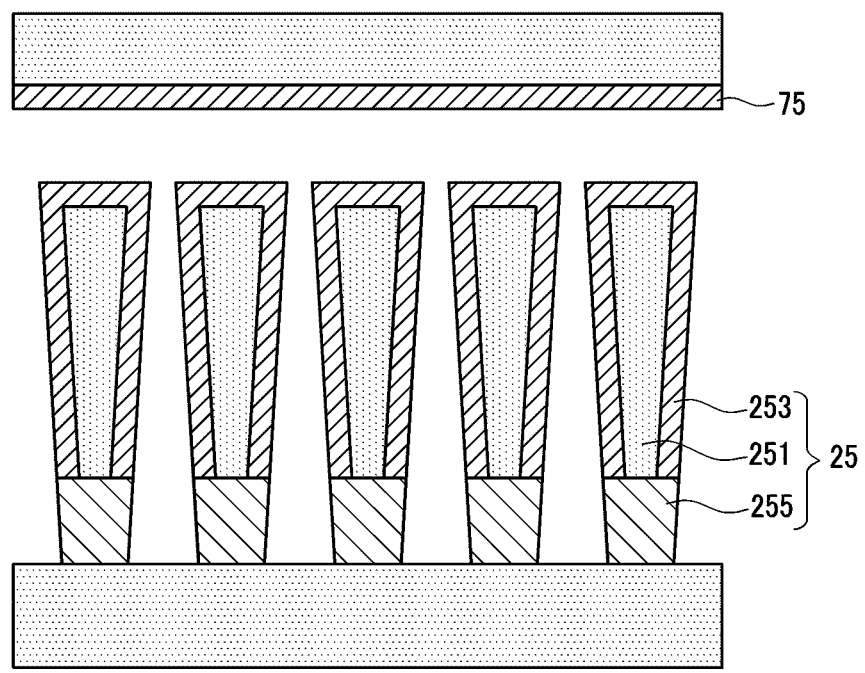

In step S45 of FIG. 15, surfaces of the plurality of nano-structures 25 are doped and the highly concentrated doping area 255 is provided at one end of each nano-structure 25. That is, as shown in FIG. 19, the surfaces of the plurality of nano-structures 25 are doped by floating phosphorous spin on glass (PSOD) 75 on the plurality of nano-structures 25 and heating the same about 1 to 30 seconds at 600° C. to 1100° C. In this case, the surfaces of the plurality of nano-structures 25 may be n-type doped. Further, the doping layer 71 (shown in FIG. 18) is applied to one end of the nano-structure 25 contacting the substrate 70 such that the highly concentrated doping area 255 is formed. As a result, the nano-structure 25 including the first doping area 251, the second doping area 253, and the highly concentrated doping area 255 is manufactured. For example, the first doping area 251 may be formed as an n type, the second doping area 253 may be formed as a p type, and the doping area 255 may be formed as a high-concentrated p type. When the reaction stated in step S45 of FIG. 15 is finished, the blocking layer 73 (shown in FIG. 18) and residues can be eliminated using diluted hydrogen fluoride solution.

Figure 20:
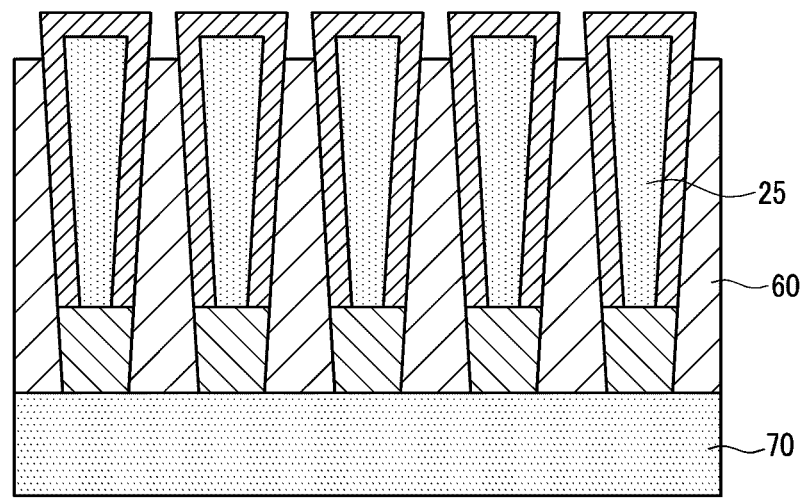

Referring back to FIG. 15, a dielectric layer 60 is provided between the plurality of nano-structures 20 in step S55. That is, as shown in FIG. 20, the dielectric layer 60 is uniformly coated over the substrate 70 between the plurality of nano-structures using a spin-coater. The coating speed may be set to be between 1000 rpm to 5000 rpm and continued for about 10 seconds to 10 minutes. PDMS may be used as a material of the dielectric layer 60. PDMS is used by being diluted with methylene chloride. Dilution concentration ratio is set to 1 to 4 for dilution of PDMS. After the PDMS coating is finished, PDMS is heated at 50° C. to 150° C. The dielectric layer 60 passivates the surface of the nano-structure 25.

An upper end of the nano-structure 25 may be externally exposed. That is, ends of the respective nano-structures 25 are covered by the dielectric layer 60 and upper ends of the nano-structures 25 may be externally exposed by plasma-etching the dielectric layer 60.

Figure 21:
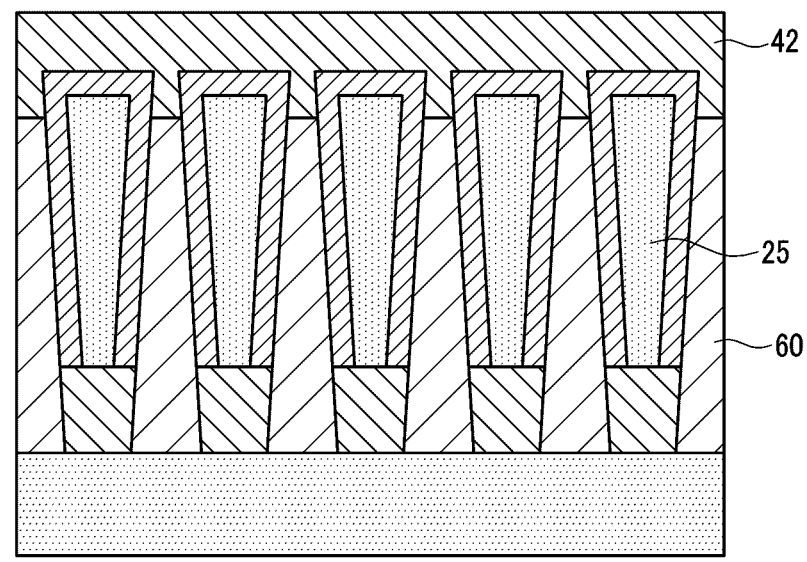

In step S65 of FIG. 15, the first conductive layer 42 covering the upper ends of the plurality of nano-structures 25 is provided. That is, as shown in FIG. 21, since the plurality of nano-structures 25 are electrically connected with the second conductive layer 42, electricity can be externally supplied.

Figure 22:
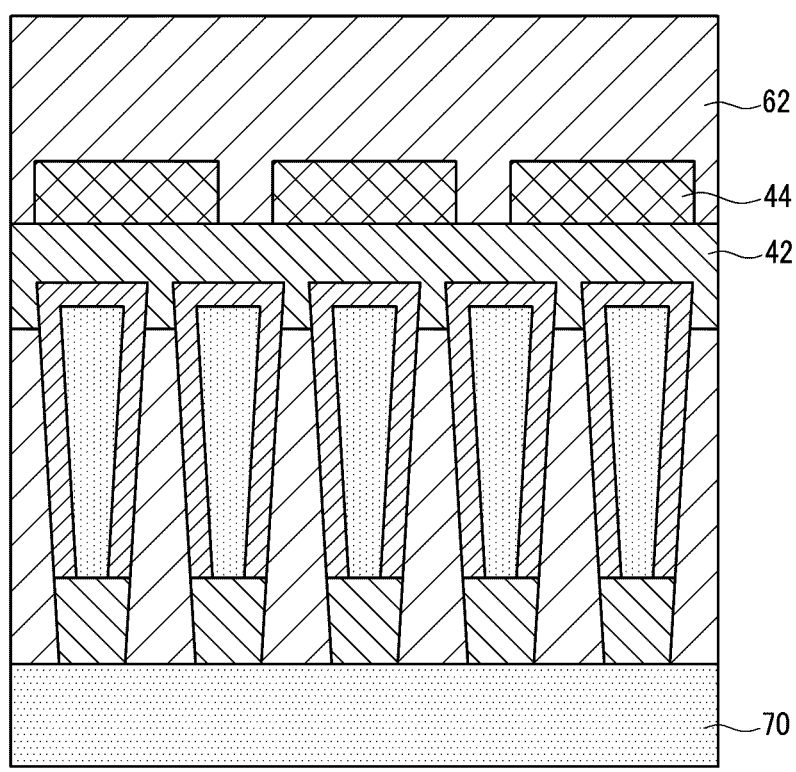

In step S75 of FIG. 15, the dielectric layer 62 is provided. As shown in FIG. 22, the metal grid 44 may be provided on the second conductive layer 42 and then the dielectric layer 62 may be provided on the metal grid 44. Alternatively, the metal grid 44 may be omitted as necessary. The metal grid 44 is attached on the second conductive layer 42 to enhance conductivity of the second conductive layer 42.

Figure 23:
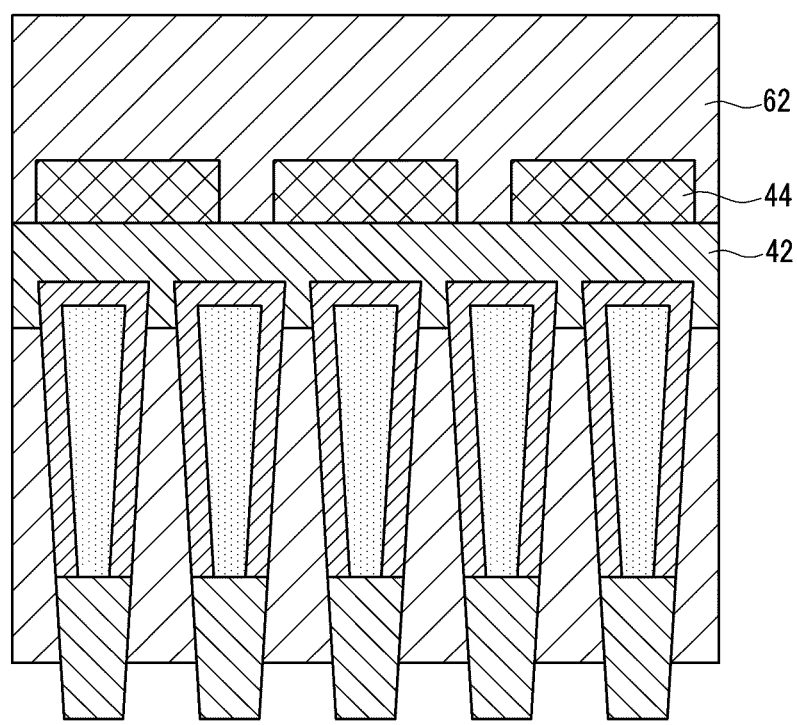

In step S85 of FIG. 15, the substrate 70 is separated from the dielectric layer 60. That is, as shown in FIG. 23, since the substrate 70 (shown in FIG. 22) is firmly supported by the dielectric layer 62, the substrate 70 is separated by being broken and pulled from the dielectric layer 60 and then may be recycled.

Figure 24:
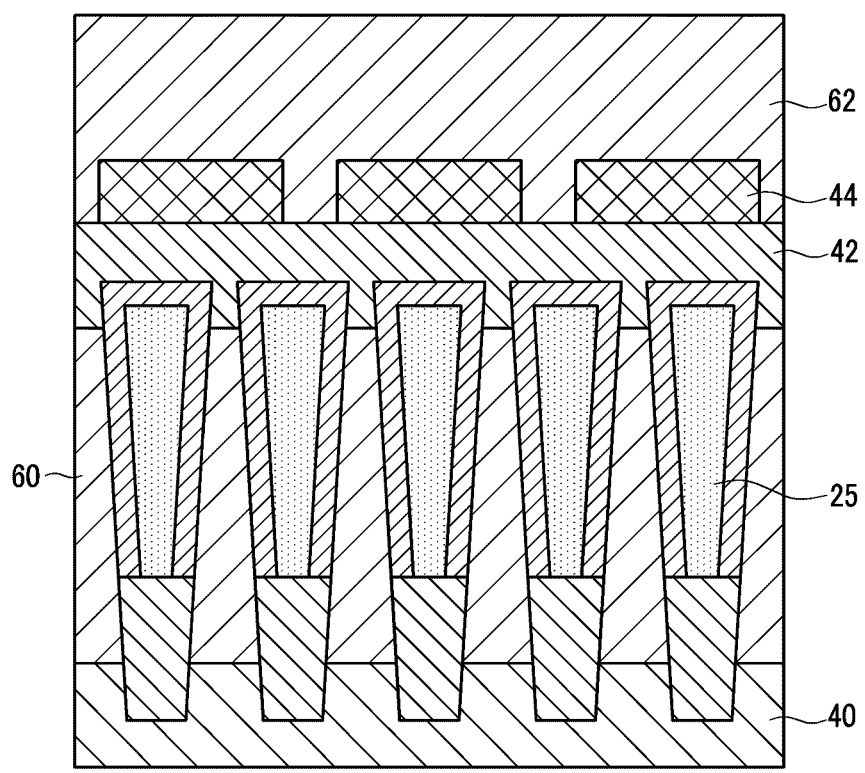

In step S95, the second conductive layer 40 contacting the dielectric layer 60 is provided. The second conductive layer 40 may be formed by being deposited under the dielectric layer 60. That is, as shown in FIG. 24, the second conductive layer 40 is electrically connected with the nano-structures 25. Thus, the solar cell 500 can be manufactured through the above-stated method.

Figure 25:
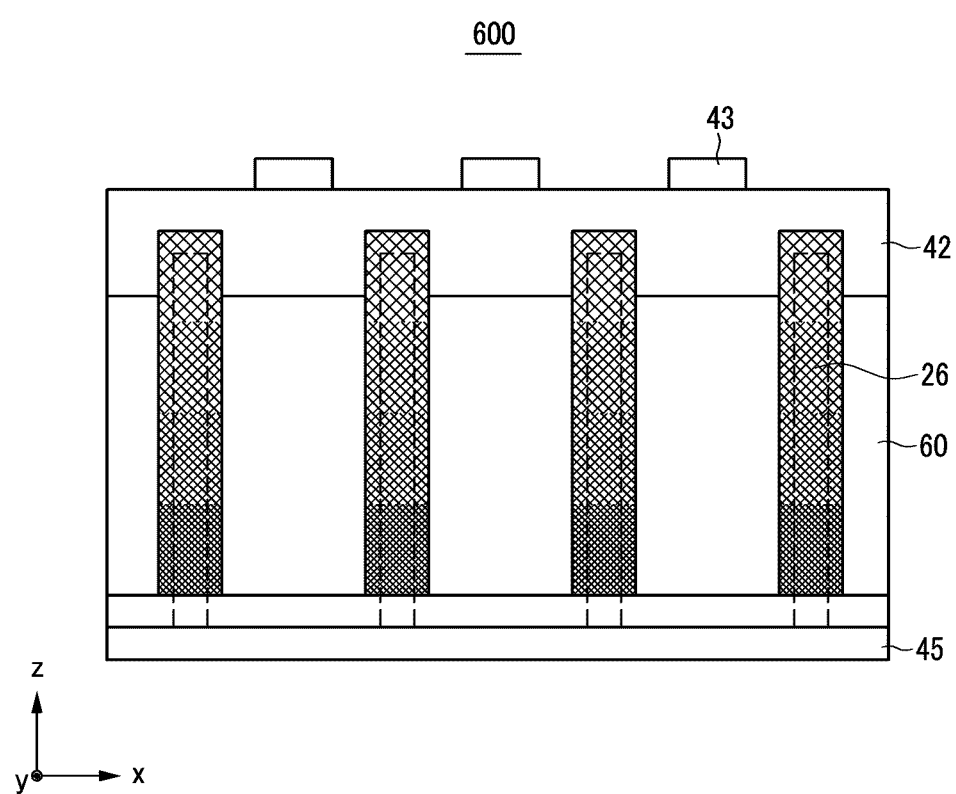
FIG. 25 is a schematic cross-sectional view of a solar cell according to a sixth exemplary embodiment of the present invention.

FIG. 25 schematically shows a cross-sectional structure of a solar cell 60 according to a sixth exemplary embodiment of the present invention. A cross-sectional structure of the solar cell 600 of FIG. 25 is similar to that of the solar cell of FIG. 15, identical parts are denoted by the same reference symbols, and a detailed description thereof is omitted.

As shown in FIG. 25, the solar cell 600 includes a plurality of nano-structures 26, a first electrode 43, a second electrode 45, a transparent conductive layer 42, and a dielectric layer 60. The solar cell 600 may further include other elements as necessary. A substrate removed during manufacturing of the solar cell 600 may be recycled.

Each nano-structure 26 has concentration gradient along a length direction thereof, that is, the z-axis direction. That is, each nano-structure 26 has a composition of $Si_{1-x}Ge_x$ ($0<x\leq0.5$). Here, x is sequentially decreased as the nano-structure 26 becomes closer to the second conductive layer 42. Preferably, x may be greater than 0 and less than 3. The nano-structure 26 having such a concentration gradient can minimize a band gap, and accordingly photovoltaic efficiency can be remarkably increased. Further, the surface of the nano-structure 26 is doped and thus pn junction is formed, and therefore electrons and holes are generated by incident light and an photovoltaic power is generated from movement of the electrodes and holes. Hereinafter, a manufacturing method of the solar cell 600 will be described in further detail with reference to FIG. 26 and FIG. 27 to FIG. 33.

Figure 26:
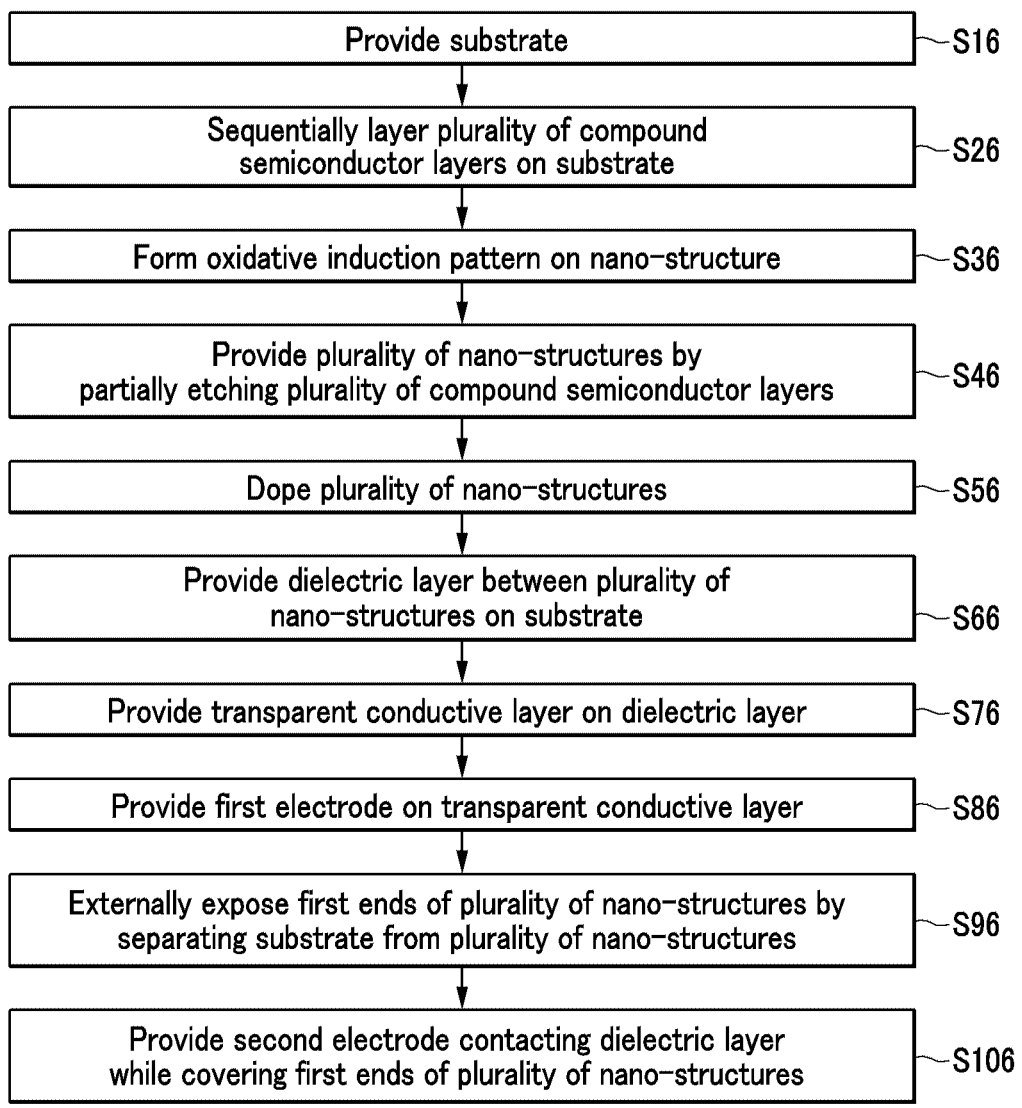
FIG. 26 is a schematic flowchart of a manufacturing method of the solar cell of FIG. 25.
Figure 27:
FIG. 27 to FIG. 35 respectively show manufacturing processes of the solar cell corresponding to the respective steps of FIG. 26.
Figure 28:
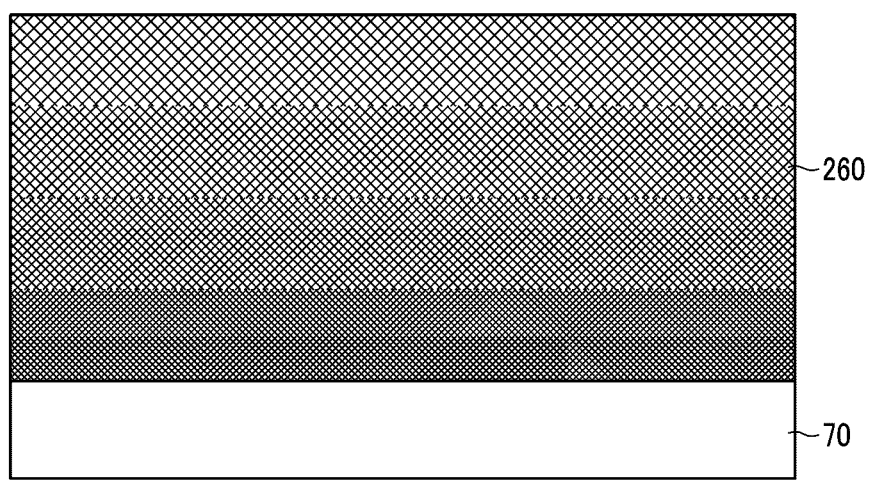

FIG. 26 is a schematic flowchart of a manufacturing method of the solar cell 600 of FIG. 25. FIG. 26 exemplarily illustrates the manufacturing method of the solar cell 600, and the present invention is not limited thereto. Therefore, the manufacturing method of the solar cell 600 may be variously modified.

As shown in FIG. 26, the manufacturing method of the solar cell 600 includes: i) providing a substrate (S16); ii) sequentially layering a plurality of compound semiconductive layers (S26); iii) forming an oxidative induction pattern on the plurality of compound semiconductive layers (S36); iv) providing a plurality of nano-structures by partially etching the plurality of compound semiconductive layers (S46); v) doping the plurality of nano-structures (S56); vi) providing a dielectric layer between the plurality of nano-structures on the substrate (S66); vii) providing a transparent conductive layer on the dielectric layer (S76); viii) providing a first electrode on the transparent conductive layer (S86); ix) externally exposing first ends of the plurality of nano-structures by separating the substrate from the plurality of nano-structures (S96); and x) providing a second electrode contacting the dielectric layer while covering the first ends of the plurality of nano-structures (S106). The manufacturing method of the solar cell 600 may further include other steps.

As shown in FIG. 26, in step S16, a substrate 70 is provided. That is, various materials such as alumina, ceramic, stainless use steel (SUS), silicon, polymer, or aluminum foil may be used as a material of the substrate 70 shown in FIG. 27.

Next, in step S26 of FIG. 26, a plurality of compound semiconductive layers 260 are sequentially layered on the substrate 70. That is, each of the plurality of compound semiconductive layers 260 has a multi-layered thin film structure having a varying composition. The compound semiconductive layers 260 may be a gallium arsenide (GaAs) layer or a silicon germanium (SiGe) layer. When the compound semiconductive layer 260 is formed with a GaAs layer, the content of N can be adjusted. In further detail, the compound semiconductive layers 260 may respectively have a composition of $GaAs_{1-x}N_x$, and each compound semiconductor 260 may have different x.

As shown in FIG. 26, in step S36, an oxidative induction pattern 262 is formed on the plurality of compound semiconductive layers 260. A mask pattern (not shown) is formed on the compound semiconductive layer 260, and then the oxidative induction layer (not shown) is formed on the mask pattern. The mask pattern (not shown) has a dotted shape. The mask pattern (not shown) may be photoresist pattern.

The oxidative induction layer (not shown) may oxide the compound semiconductive layer 260 by a galvanic effect. A reduction potential of the oxidative induction layer (not shown) may be higher than that of the compound semiconductive layer 260. For example, the oxidative induction layer (not shown) may be a noble metal such as Ag, Au, and Pt.

Figure 29:
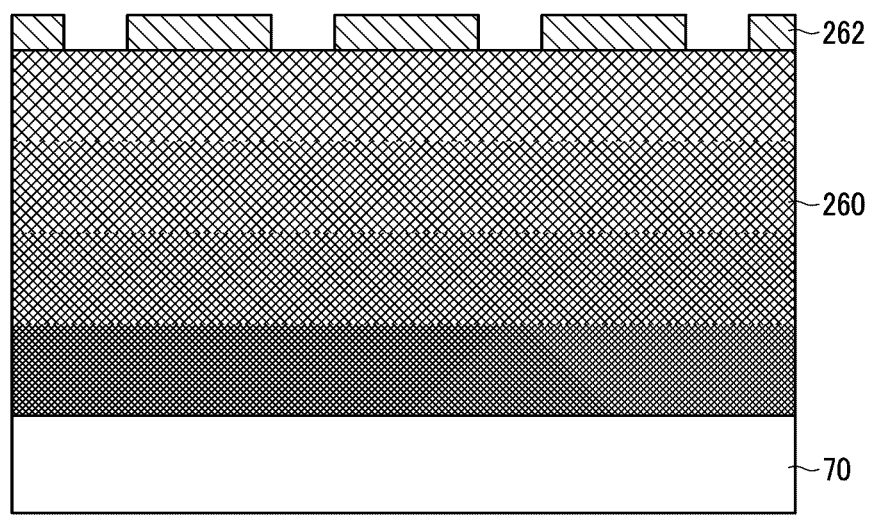

As shown in FIG. 29, the oxidative induction pattern 262 is formed by eliminating the mask pattern (not shown). Thus, the oxidative induction pattern 262 is disposed on the compound semiconductive layer 260.

Referring back to FIG. 26, in step S46, a plurality of nano-structures are provided by partially etching the plurality of compound semiconductive layers. That is, electrolyte is brought into contact with the oxidative induction pattern 262 and the compound semiconductive layer 260. In further detail, a substrate where the oxidative induction pattern 262 is formed may be dipped into an electrolyte solution. In this case, due to a reduction potential difference between the oxidative induction pattern 262 and the compound semiconductive layer 260, a plane where the compound semiconductive layer 260 contacts the oxidative induction pattern 262 is oxidized such that oxide is generated. When the electrolyte solution further includes an etchant that etches oxide, the plane where the compound semiconductive layer 260 contacts the oxidative induction pattern 262 may be selectively etched.

Figure 30:
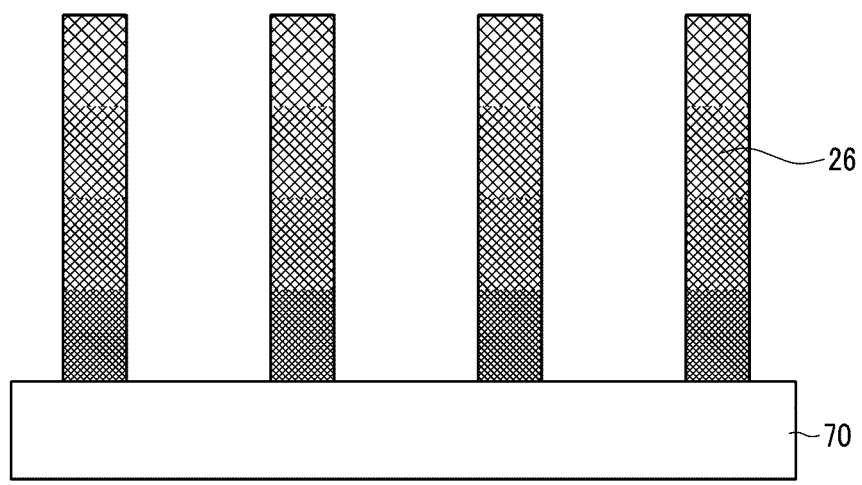

As a result, as shown in FIG. 30, an area of the compound semiconductive layer 260 that is not in contact with the oxidative induction pattern 262 is remained such that the nanostructure 26 is formed. In this case, etching time can be controlled to prevent the substrate 70 from being etched or minimize etching of the substrate 70. When the compound semiconductive layer 260 is a silicon germanium layer having a varying composition, the electrolyte solution including etchant may be a $HF/H_2O_2$ solution. Meanwhile, the residual oxidative induction pattern 262 is eliminated using a HF-diluted solution.

When the substrate 70 is formed with silicon, a lower portion of the compound semiconductive layer 260 is formed with a material of $Si_{0.5}Ge_{0.5}$ or $Si_{0.7}Ge_{0.3}$, and an upper area of the compound semiconductive layer 260 is formed with silicon, a strain may occur between the substrate 70 and the lower area of the compound semiconductive layer 260 due to lattice mismatch. However, when the nano-structure 26 is manufactured by etching the compound semiconductive layer 260, the strain due to lattice mismatch may be relaxed. Accordingly, possibility of occurrence of failure can be reduced.

Figure 31:
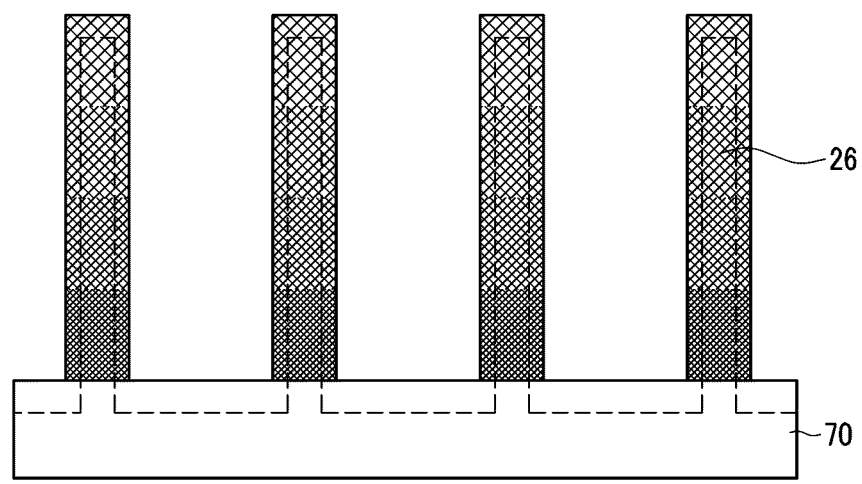

Referring back to FIG. 26, core-shell type nano-structures 26 are manufactured by doping the plurality of nano-structures in step S56. That is, as shown in FIG. 31, a plasma-ion doping method or a monolayer doping (MLD) method may be used to manufacture the nano-structures 26. With such a method, a conformal and thin pn junction is formed in the surface of the nano-structure 26.

Figure 32:
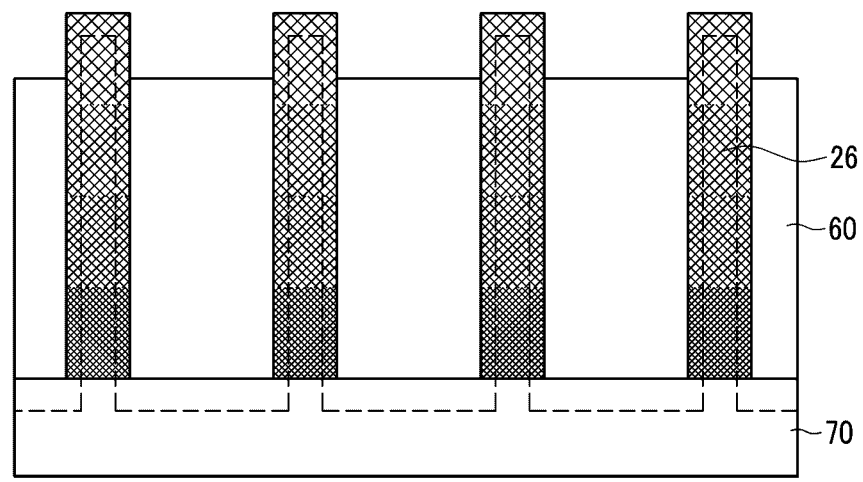

In step S66 of FIG. 26, the dielectric layer 60 is formed between the plurality of nano-structures 26 formed on the substrate 70. That is, as shown in FIG. 32, the dielectric layer 60 is formed while in the state that upper ends of the respective nano-structures 26 are exposed onto the dielectric layer 60.

Figure 33:
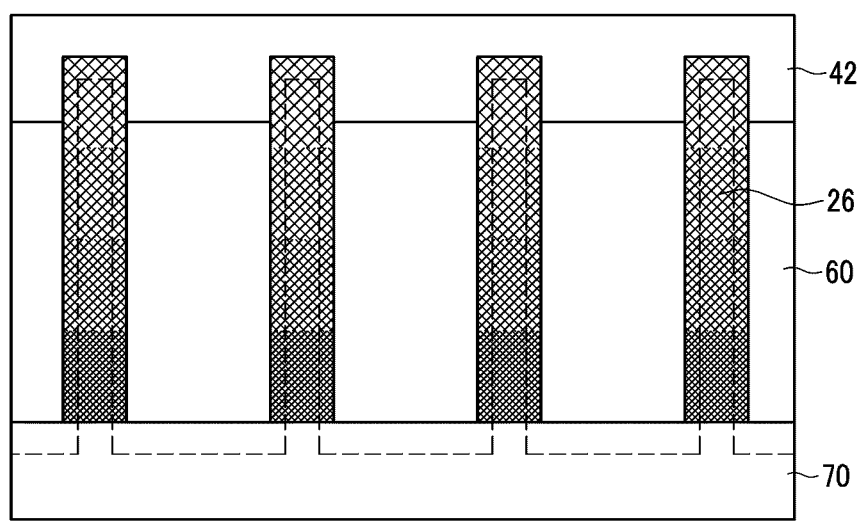

Next, in step S76 of FIG. 26, the transparent conductive layer 42 is provided on the dielectric layer 60. That is, as shown in FIG. 33, the upper ends of the nano-structures 26 are covered by the transparent conductive layer 42 by providing the transparent conductive layer 42 on the dielectric layer 60. Here, ZnO, ITO, or a conductive polymer may be used as a material of the transparent conductive layer 42.

Figure 34:
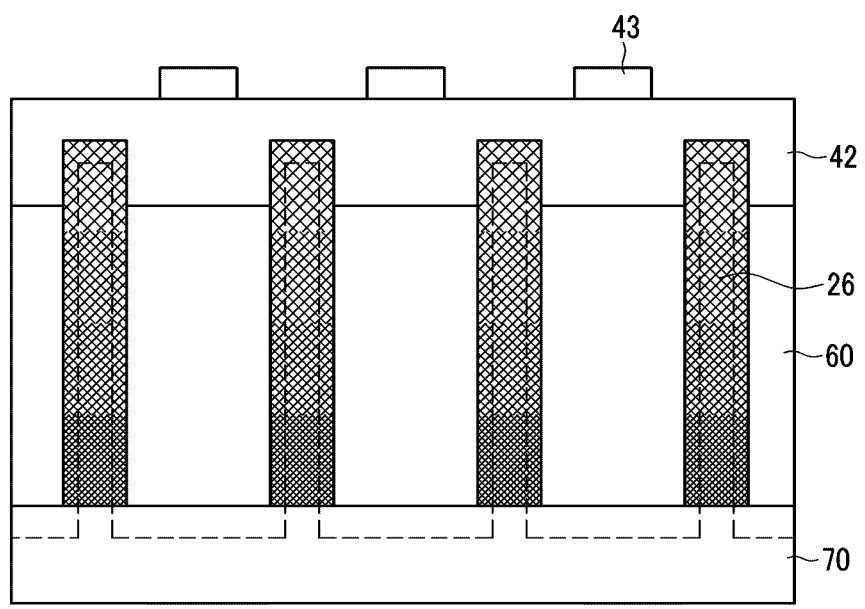

Referring back to FIG. 26, in step S86, the first electrode 43 is provided on the transparent conductive layer 42. As shown in FIG. 34, the first electrode 43 may be formed of a Ti/Al thin film. The first electrode 43 may be formed by forming an electrode film on the transparent conductive layer 42 and then patterning the electrode film.

Figure 35:
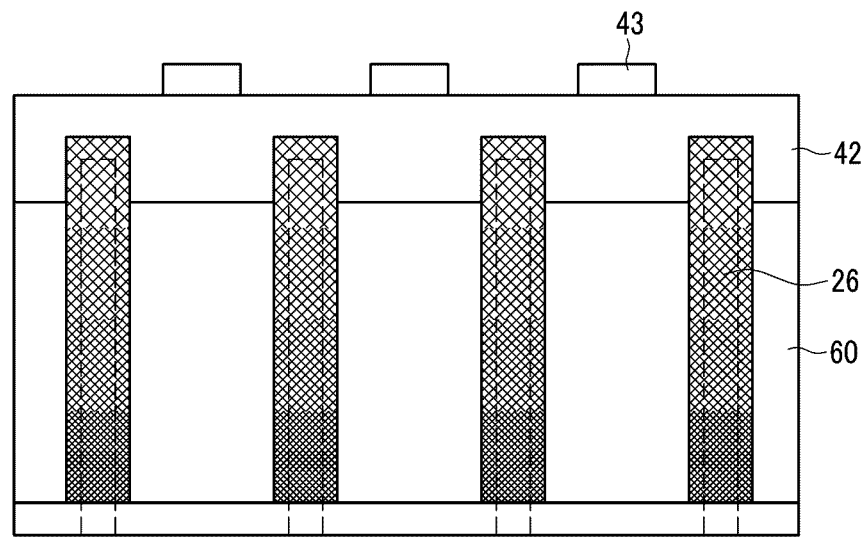

Next, in step S96 of FIG. 26, the plurality of nano-structures 27 are externally exposed by separating the substrate 70 from the plurality of nano-structures 26. That is, as shown in FIG. 35, the substrate 70 (shown in FIG. 34) is separated from the plurality of nano-structures 26. Accordingly, the substrate 70 can be recycled.

In step S106 of FIG. 26, the second electrode 45 (shown in FIG. 25) that contacts the dielectric layer 60 while covering one ends of the plurality of nano-structures 26 is provided. That is, the second electrode 45 (shown in FIG. 25) formed of an Al thin film is formed under the dielectric layer 60 (shown in FIG. 25).

With the above-stated manufacturing method, the solar cell 600 (shown in FIG. 25) can be manufactured. Since the substrate 70 (shown in FIG. 34) used in manufacturing of the solar cell 600 can be recycled, manufacturing cost of the solar cell 600 can be significantly reduced.

In addition to the above-stated method, nano-structures having concentration gradients can be selectively grown by controlling a concentration of a deposited material after forming openings by patterning a mask layer on the substrate. In this case, a solar cell having the same structure of the solar cell 600 of FIG. 25 can be manufactured.

Figure 36:
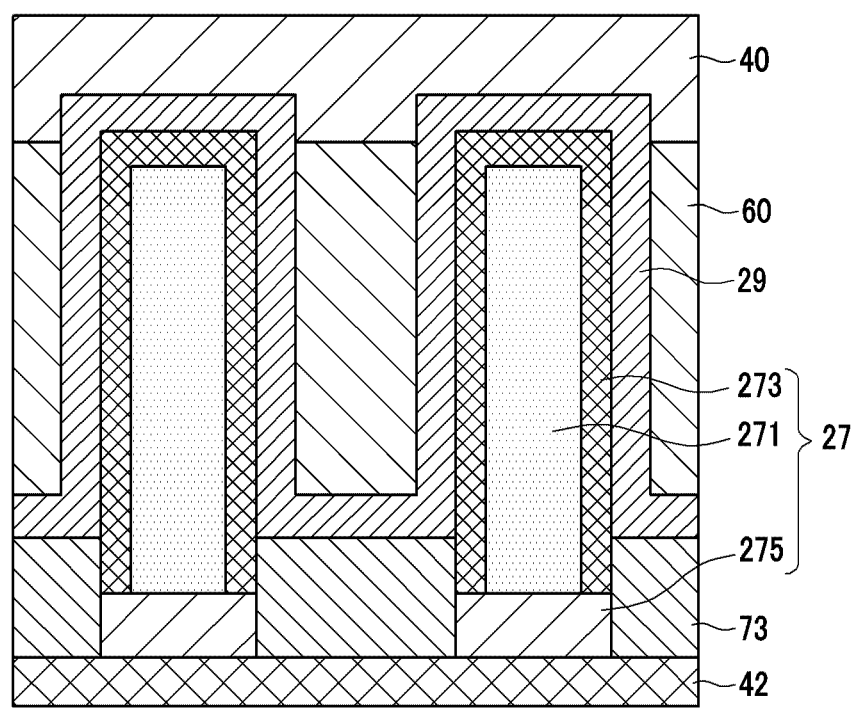
FIG. 36 is a schematic cross-sectional view of a solar cell according to a seventh exemplary embodiment of the present invention.

FIG. 36 schematically shows a cross-sectional structure of a solar cell 700 according to a seventh exemplary embodiment of the present invention. Since the structure of the solar cell 700 of FIG. 36 is similar to that of the solar cell 500 of FIG. 14, identical parts are denoted by the same reference symbols, and a detailed description thereof is omitted.

As shown in FIG. 36, the solar cell 700 includes a plurality of nano-structures 27, a first electrode 40, a second electrode 42, a dielectric layer 60, a blocking layer 73, and a transparent conductive layer 29. Each nano-structure 27 includes a first doping area 271, a second doping area 273, and a high-concentrated p-type doping area 275. The above-stated elements may be partially omitted in the solar cell 700. Alternatively, other elements may be further added to the solar cell 700.

As shown in FIG. 36, the transparent conductive layer 29 covers surfaces of the plurality of nano-structures 27. The transparent conductive layer 29 contacts the dielectric layer 60 and the first electrode 40. ITO may be used as a material of the transparent conductive layer 29. Since the transparent conductive layer 29 covers the surfaces of the plurality of nano-structures 27, photo-generated carriers formed from the nano-structures 27 can be efficiently collected. The blocking layer 73 is disposed on the second conductive layer 42 and covers the high-concentrated p-type doping area 275. Thus, the transparent conductive layer 29 and the second electrode 42 are not electrically connected due to the blocking layer 73, thereby preventing occurrence of short-circuit.

Figure 37:
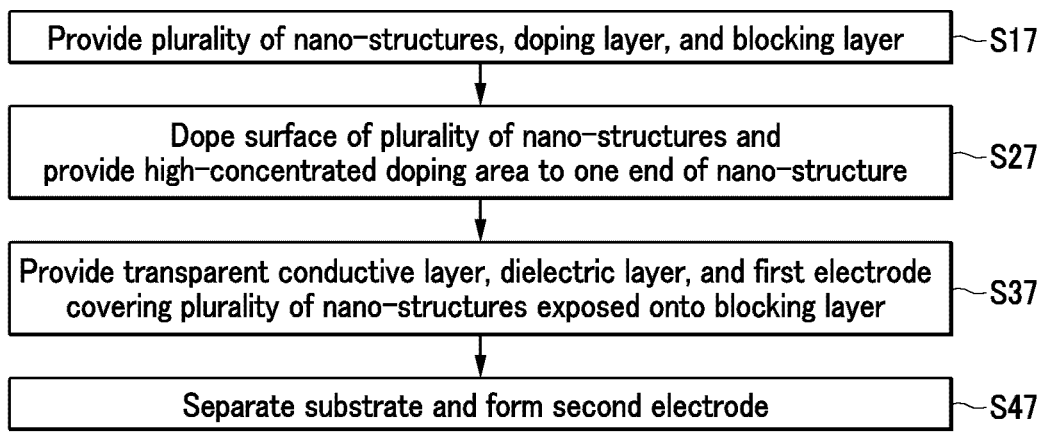
FIG. 37 is a schematic flowchart of a manufacturing process of the solar cell of FIG. 36.

FIG. 37 schematically shows a flowchart of a manufacturing method of the solar cell 700 of FIG. 36. The manufacturing method of the solar cell 700 of FIG. 37 is similar to that of the solar cell 500 of FIG. 16, identical parts are denoted by the same reference symbols, and a detailed description thereof is omitted. Hereinafter, the manufacturing method of the solar cell 700 will be described in further detail with reference to FIG. 37 and FIG. 38 to FIG. 45.

As shown in FIG. 37, the manufacturing method of the solar cell 700 includes: i) providing a plurality of nano-structures, a doping layer, and a blocking layer (S17); ii) doping surfaces of the plurality of nano-structures and providing a high-concentrated doping area to a first end of each nano-structure (S27); iii) providing a transparent conductive layer, a dielectric layer, and a first electrode that cover the plurality of nano-structures exposed onto the blocking layer (S37); and iv) separating the substrate and forming the second electrode (S47). The manufacturing method of the solar cell 700 may further include other steps as necessary.

Figure 38:
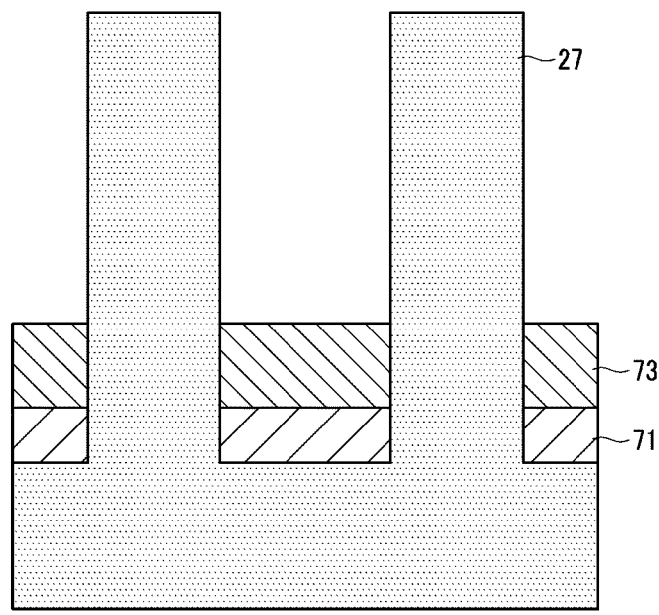
FIG. 38 to FIG. 41 respectively show manufacturing processes of the solar cell corresponding to the respective steps of FIG. 37.

As shown in FIG. 37, in step S17, the plurality of nano-structures 27, a doping layer 71, and the blocking layer 73. The blocking layer 73 may be formed by undoped spin on glass (SOG). That is, as shown in FIG. 38, the doping layer 71 and the blocking layer 73 are layered between the plurality of nano-structures 27.

Figure 39:
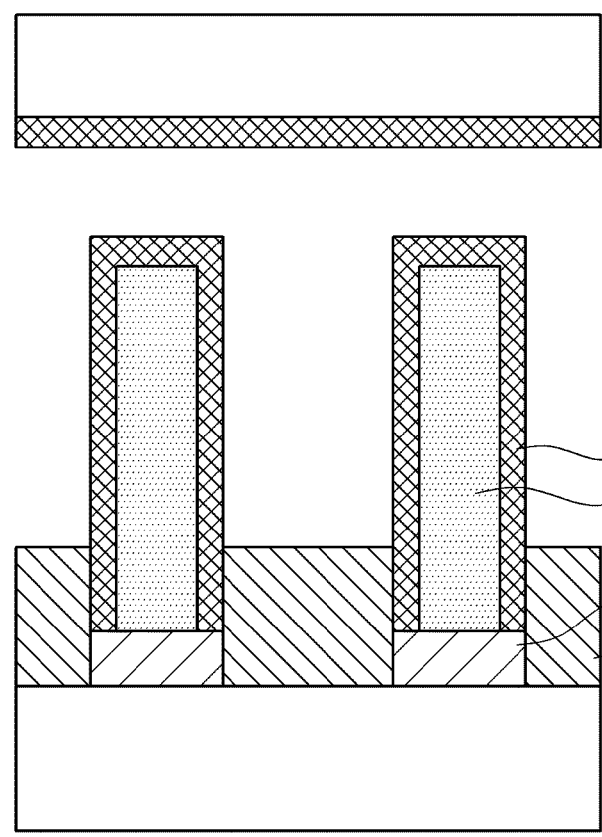

In step S27 of FIG. 37, the surfaces of the plurality of nano-structures 27 are doped and the high-concentrated doping area 275 is provided to a first end of each of the nano-structures 27. For example, the high-concentrated doping area 275 may be formed using boron. As shown in FIG. 39, the first doping area 271 and the second doping area 273 are formed while the surfaces of the plurality of nano-structures 27 are doped.

Figure 40:
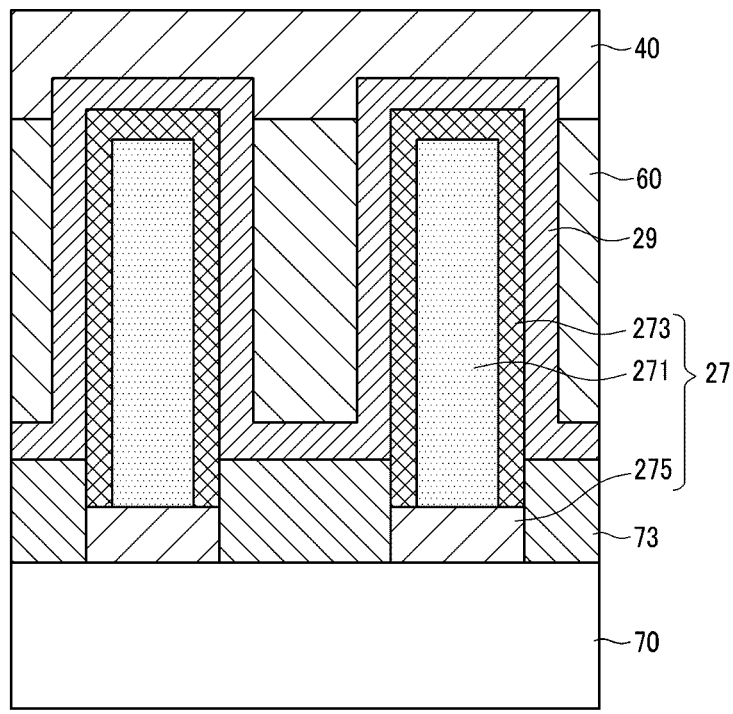

In step S37 of FIG. 37, the transparent conductive layer 29, the dielectric layer 60, and the first electrode 40 that cover the plurality of nano-structures 27 exposed onto the blocking layer 73 are provided. Here, PDMS may be used as a material of the dielectric layer 60. That is, as shown in FIG. 40, the first electrode 40 electrically contacts the transparent conductive layer 29 protruding over the dielectric layer 60.

Figure 41:
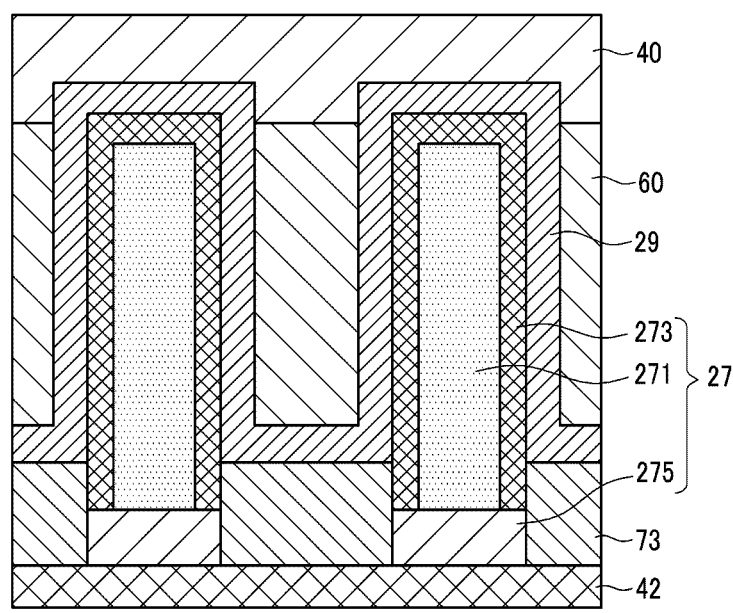

Next, in step S47 of FIG. 37, the separated 70 is separated and the second electrode 42 contacting the high-concentrated doping area 275 is formed. The high-concentrated doping area 275 electrically contacts the second electrode 42 in good condition. That is, as shown in FIG. 41, the substrate 70 (shown in FIG. 40) should be easily separated from the blocking layer 73. Thus, the blocking layer 73 preferably has a small thickness for the substrate 70 (shown in FIG. 40) to be easily separated from the blocking layer 73.

Hereinafter, the present invention will be described in further detail through an experimental example. The experimental example of the present invention is an example of the present invention, and the present invention is not limited thereto.

Experimental Example

A solar cell was manufactured using the same manufacturing method of the solar cell according to the first exemplary embodiment of the present invention. A metal was deposited on an over-doped silicon substrate by providing a hole-shape patterned oxide mask layer. Next, the oxide mask layer was separated and then the metal was made to be remained only on an externally exposed portion of the silicon substrate. A nano-structure was made to selectively grow perpendicularly to one direction only in a portion where a metal catalyst is provided through a chemical vapor deposition (CVD) process that supplies a source gas including Si.

Next, a metal was electro-plated only in a lower end portion of the nano-structure that has been grown perpendicularly to one direction on the substrate. Then the nano-structure was thermally treated to form a silicide in the lower end portion of the nano-structure. Details of the manufacturing method of the solar cell are known to a person skilled in the art, and therefore no further description will be provided.

Figure 42:
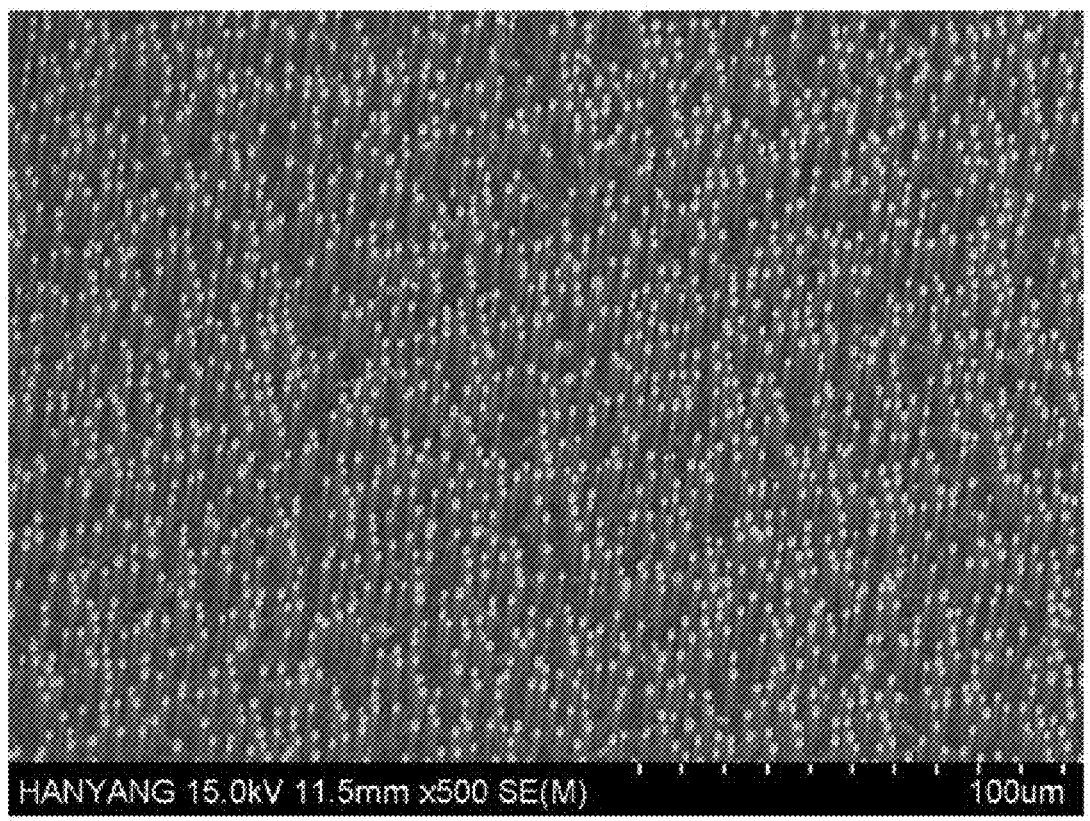
FIG. 42 is a scanning electron microscope (SEM) photo of nanostructures included in a solar cell manufactured according to an experiment example of the present invention.

FIG. 42 is a SEM photo of nano-structures included in a solar cell manufactured according to the experimental example of the present invention. FIG. 42 corresponds to FIG. 8.

As shown in FIG. 42, it could be observed that nano-structures having a diameter of about 2 μm were grown on the substrate. The nano-structures were grown in one direction on the substrate.

Figure 43:
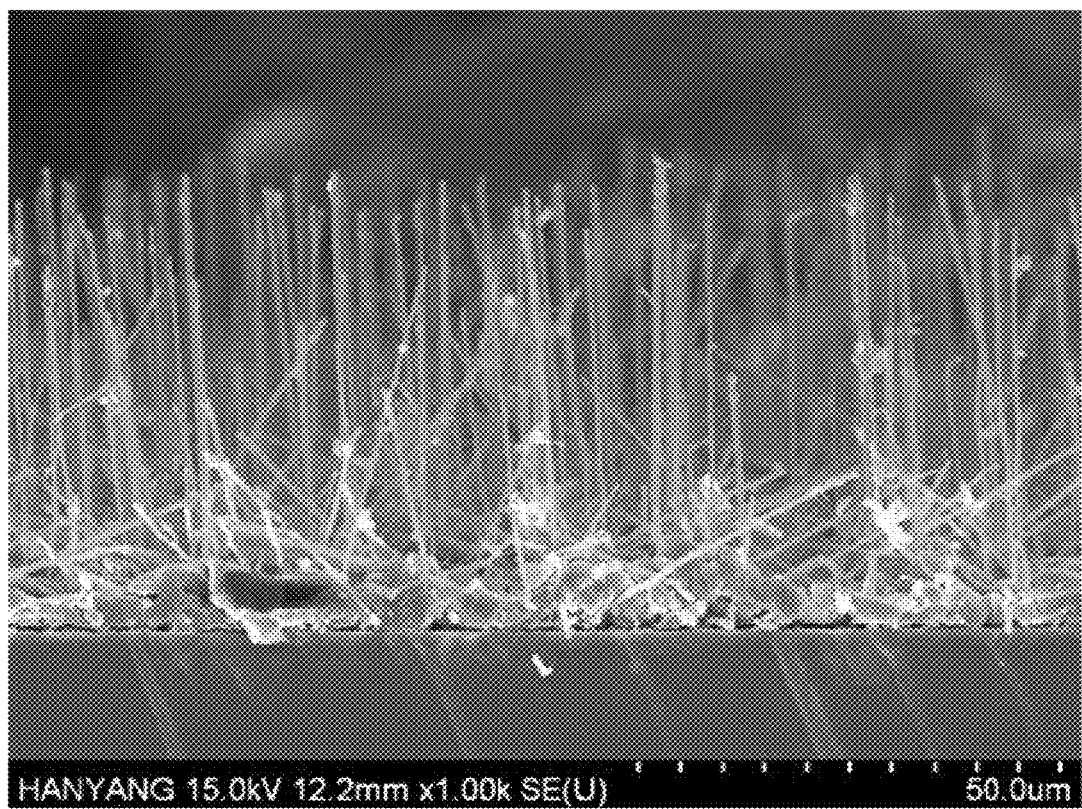
FIG. 43 is a SEM photo showing a side view of the nanostructure of FIG. 42.

FIG. 43 is an enlarged SEM photo of the nano-structure of FIG. 42.

As shown in FIG. 43, it also could be observed than a silicide was formed at a lower end of the nano-structure. That is, the nano-structure was fixed by the silicide.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
a plurality of nano-structures serially arranged along an x-y plane direction such that each of the plurality of nano-structures is spaced from each other, not contacting each other;
a first conductive layer directly covering a first end of each of the plurality of nano-structures such that the first end is located in the first conductive layer;
a second conductive layer distanced from the first conductive layer along a z-axis direction, the second conductive layer directly covering a second end of each of the plurality of nano-structures such that the second end is located in the second conductive layer;
a dielectric layer disposed between the first conductive layer and the second conductive layer such that one side of the dielectric layer contacts the first conductive layer and the other side of the dielectric layer contacts the second conductive layer, and a thickness of the dielectric layer corresponding to a distance between the one side and the other side of the dielectric layer is constant along the x-y plane direction, the dielectric layer directly contacting a portion of each of the plurality of nano-structures that connects the first end and the second end;
a transparent contact layer directly contacting the first conductive layer;
a first contact portion formed in an upper portion of the transparent contact layer;
a second contact portion formed in an upper portion of the second conductive layer;
a first silicide layer formed at the first end of each of the plurality of nano-structures such that both the first end and the first silicide layer are located in the first conductive layer, wherein the first silicide layer is configured to function as a catalyst for growth of each of the plurality of nano-structures; and
a second silicide layer formed at the second end of the nano-structure such that both the second end and the second silicide layer are located in the second conductive layer,
wherein each of the plurality of nano-structures comprises an n-type doping area and a first p-type doping area, the first p-type doping area surrounding the n-type doping area,
wherein a first portion of the n-type doping area and a second portion of the first p-type doping area surrounding the first portion are surrounded by the second silicide layer,
wherein the first contact portion and the second contact portion are connected with a passive element such that the passive element is supplied with power using the solar cell,
wherein a highly concentrated second p-type doping area is formed in each of the plurality of nano-structures, the second p-type doping area contacting the first silicide layer and the first conductive layer, and
wherein each of the plurality of nano-structures is formed in a shape of a nano-rod that extends along the z-axis direction such that each of the plurality of nano-structures is parallel to each other.

2. The solar cell of claim 1, further comprising:
a light transmissive layer contacting the transparent contact layer.

3. The solar cell of claim 1, wherein the transparent contact layer comprises indium tin oxide (ITO).

4. The solar cell of claim 1, wherein a metal nano-particle is provided on a surface of each of the plurality of nano-structures.

5. The solar cell of claim 1, wherein each of the plurality of nano-structures comprises a first diameter contacting the first conductive layer and a second diameter contacting the second conductive layer, and the first diameter is smaller than the second diameter.

6. The solar cell of claim 5, wherein a diameter of each nano-structure is gradually decreased as becoming closer to the first conductive layer along a length direction of the nano-structure.

7. The solar cell of claim 5, wherein the second p-type doping area is formed in the first end of each nano-structure, and is disposed in the first conductive layer.

8. The solar cell of claim 7, further comprising a blocking layer disposed on the first conductive layer between the plurality of nano-structures and covering the second p-type doping area.

9. The solar cell of claim 5, further comprising another dielectric layer disposed opposite to the dielectric layer, interposing the second conductive layer therebetween.

10. The solar cell of claim 9, wherein the other dielectric layer has a thickness of 0.5 mm to 30 mm.

11. The solar cell of claim 10, wherein the dielectric layer and the other dielectric layer respectively comprise polydimethylsiloxane (PDMS).

12. The solar cell of claim 1, wherein each of the plurality of nano-structures has concentration gradient along a length direction thereof.

13. The solar cell of claim 12, wherein each nano-structure has a composition of $Si_{1-x}Ge_x$ ($0<x\leq0.5$), and x is sequentially decreased as becoming close to the second conductive layer along the length direction of the nano-structure.

14. The solar cell of claim 13, wherein each of the plurality of nano-structures has a composition of $Si_{1-x}Ge_x$ ($0<x\leq0.3$).

15. The solar cell of claim 1, further comprising a transparent conductive layer covering a surface of the plurality of nano-structures and contacting the dielectric layer and the second conductive layer.

\* \* \* \* \*